United States Patent
Wada et al.

(10) Patent No.: US 10,544,045 B2
(45) Date of Patent: Jan. 28, 2020

(54) OZONE GENERATION SYSTEM AND METHOD FOR OPERATING SAME

(71) Applicant: Mitsubishi Electric Corporation, Chiyoda-ku (JP)

(72) Inventors: Noboru Wada, Chiyoda-ku (JP); Yusuke Nakagawa, Chiyoda-ku (JP)

(73) Assignee: Mitsubishi Electric Corporation, Chiyoda-ku (JP)

( * ) Notice: Subject to any disclaimer, the term of this patent is extended or adjusted under 35 U.S.C. 154(b) by 345 days.

(21) Appl. No.: 15/503,957

(22) PCT Filed: Jul. 28, 2015

(86) PCT No.: PCT/JP2015/071309
§ 371 (c)(1),
(2) Date: Feb. 14, 2017

(87) PCT Pub. No.: WO2016/047264
PCT Pub. Date: Mar. 31, 2016

(65) Prior Publication Data
US 2017/0275165 A1    Sep. 28, 2017

(30) Foreign Application Priority Data
Sep. 22, 2014    (JP) .................. 2014-192134

(51) Int. Cl.
C01B 13/11    (2006.01)
H01J 37/34    (2006.01)
H01M 4/76    (2006.01)

(52) U.S. Cl.
CPC .......... *C01B 13/11* (2013.01); *H01J 37/3438* (2013.01); *H01M 4/765* (2013.01);
(Continued)

(58) Field of Classification Search
None
See application file for complete search history.

(56) References Cited

U.S. PATENT DOCUMENTS

| 5,792,326 A | 8/1998 | Harada et al. |
| 2015/0021162 A1 | 1/2015 | Wada et al. |
| 2017/0183229 A1* | 6/2017 | Wada ................ C01B 13/11 |

FOREIGN PATENT DOCUMENTS

| JP | 4-31302 A | 2/1992 |
| JP | 7-330310 A | 12/1995 |

(Continued)

OTHER PUBLICATIONS

Combined Office Action and Search Report dated Apr. 16, 2018 in Chinese Patent Application No. 201580048092.3 (with unedited computer generated English translation), 15 pages.

(Continued)

*Primary Examiner* — Kishor Mayekar
(74) *Attorney, Agent, or Firm* — Oblon, McClelland, Maier & Neustadt, L.L.P.

(57) ABSTRACT

In an ozone generating system in which an intermittent operation is performed, in which an ozone generating operation period in which ozone is generated by discharging gas which contains oxygen in a discharge space of an ozone generating apparatus and an ozone generating operation standby period in which gas is sealed in an ozone generating apparatus and discharge is stopped so as not to generate ozone are performed repeatedly, an absorbent which absorbs at least one of nitric acid and nitrogen oxide is provided in an ozone generating apparatus other than the discharge space.

16 Claims, 12 Drawing Sheets

(52) U.S. Cl.
CPC ...... *C01B 2201/14* (2013.01); *C01B 2201/30* (2013.01); *C01B 2201/76* (2013.01)

(56) References Cited

FOREIGN PATENT DOCUMENTS

| | | |
|---|---|---|
| JP | 2002-265204 A | 9/2002 |
| JP | 2008-222495 A | 9/2008 |
| WO | WO 2013/150819 A1 | 10/2013 |

OTHER PUBLICATIONS

International Search Report dated Sep. 15, 2015 in PCT/JP2015/071309 filed Jul. 28, 2015.

* cited by examiner

OZONE GENERATION SYSTEM AND METHOD FOR OPERATING SAME

TECHNICAL FIELD

This invention relates to an ozone generating system using an ozone generating apparatus for generating ozone by using discharge, and its operation method.

BACKGROUND ART

In an ozone generating apparatus in which ozone ($O_3$) is generated using gas including oxygen as a material gas by using discharge, it is generally known such that nitrogen oxide ($NO_x$) is by-produced when ozone is generated. Further, nitrogen oxides ($NO_x$) which is by-produced is under the coexistence of ozone, most of nitrogen oxides ($NO_x$) is present as the structure of dinitrogen pentoxide ($N_2O_5$). Dinitrogen pentoxide ($N_2O_5$) is a subliming material which becomes a solid at room temperatures lower than 30 degrees centigrade, therefore dinitrogen pentoxide ($N_2O_5$) easily changes its phase between a solid and gas. However, under ordinary operation conditions, it is very probable such that dinitrogen pentoxide ($N_2O_5$) is attached to almost whole area of a discharge space as a discharge product.

On the other hand, regarding general ozone generating apparatuses, a periodical check, which is performed once in three to five years, is recommended by suppliers. When a periodical check is performed, maintenance operation, in which all systems are halted, and further, ozone generating systems are opened to the atmospheric air, electrodes are taken out for cleaning, is performed. When an ozone generating apparatus to which solid $N_2O_5$ is attached is opened to the atmospheric air, it is concerned such that $N_2O_5$ reacts with moisture in the air, nitric acid ($HNO_3$) is generated so as to corrode metallic materials. Especially, when electrode parts are corroded, at the time of restarting, ozone generation efficiency is reduced, and further, in some cases, a short circuit between electrodes may be caused. Further, a dew-point of a material gas is an important control factor. Moisture which remains the inside of an ozone generating apparatus after an ozone generating apparatus is opened to the atmospheric air or moisture which is accompanied by a material gas reacts with $N_2O_5$ which is generated in an ozone generating apparatus at the time of restarting and $HNO_3$ is secondarily produced. Consequently, sufficient gas purge and lowering dew-point is necessary for an ozone generating apparatus.

A method for handling an ozone generating apparatus in which by using a water heating system so as to maintain heating an ozone generating apparatus tank, $N_2O_5$ which is attached to the inside of an ozone generating apparatus is vaporized to be removed, is disclosed (for example, refer to Patent Document 1), and it is proposed such that before an ozone generating apparatus is opened to the atmospheric air, $N_2O_5$ which is a factor for generating $HNO_3$ is removed.

Further, with respect to an ozone generating apparatus in which gas is sealed in a tank, and an operation is stopped, an ozone generating apparatus, having means for circulating dry gas in order to prevent moisture entering from outside and prevent generating $HNO_3$ in an ozone generating apparatus, is proposed (for example refer to Patent Document 2).

An ozone generating apparatus, in which in a case where an operation of an ozone generating apparatus has to be stopped without performing a proper stopping step such as emergency shut down, because an ozone generating apparatus needs to be opened to the atmospheric air immediately, in order to suppress corrosion of electrodes which is caused by $HNO_3$ which is inevitably generated, at an end of an electrode tube corresponding to the side of entrance of a material gas, a gas flow amount controlling plug is provided so as to limit an amount of $HNO_3$ which enters the inside of an electrode tube, and corrosion of electrodes which are arranged the inside of electrode tube is reduced, is proposed (for example, refer to Patent Document 3).

As above mentioned, the anxiety of corrosion of a metallic material which is caused by $HNO_3$ in an ozone generating apparatus is discussed on the assumption that an ozone generating apparatus is opened to the atmospheric air, or an ozone generating apparatus is contacted with moisture in the atmospheric air, and measures are considered. In order to suppress corrosion of a metallic material, especially corrosion of an electrode which is caused by $HNO_3$, it is important such that $N_2O_5$, which is a factor of corrosion, and moisture is not contacted with the inside of an ozone generating apparatus, in a case of a cylindrical multi-tube ozone generating apparatus, it is especially important such that $N_2O_5$ and moisture is not contacted with the inside of an electrode tube. Conventionally, accompanying of moisture is prevented by using gas having a low dew-point for an ozone generating apparatus, and after ozone is generated, before an ozone generating apparatus is opened to the atmospheric air, by adequately replacing gas in an ozone generating apparatus, remaining $NO_x$ is removed and an electrode part can be prevented from contacting with $HNO_3$.

PRIOR ART REFERENCE

Patent Document

[Patent Document 1]
Japanese Patent Application Laid-Open No. 2002-265204 (Paragraph 0025 to 0035, FIG. 1 to FIG. 3)
[Patent Document 2]
Japanese Patent Application Laid-Open No. 1992-31302 (Page 5 to 6, FIG. 2)
[Patent Document 3]
Japanese Patent Application Laid-Open No. 2008-222495 (Paragraph 0018 to 0024, FIG. 2 to FIG. 4)

DISCLOSURE OF THE INVENTION

Problems to be Solved by the Invention

Regarding ozone generating apparatuses so called a cylindrical multi-tube type which will be applied to water treatment in many cases, the tendency of reducing cost is high density and high integration of electrode tubes which can be mounted per one apparatus. Further, an electrode tube which is mentioned here includes a combination of a metallic ground electrode tube and a high voltage electrode tube having a conductive layer which is provided at an inner surface of a dielectric tube which is made of glass, ceramics, etc., which are arranged concentrically and coaxially. In order to realize high density and high integration, there is the tendency such that a diameter of one electrode tube to be applied is reduced, therefore, a low-cost electrode tube which is sold on the open market can be used. On the other hand, when the diameter of an electrode tube is reduced, with respect to a high voltage electrode tube, the technology for forming a conductive layer is limited, therefore a conductive layer to be formed is made to be a thinner film, inevitably. Understandably, when a conductive layer is made to be a thinner film, in comparison with a thick film, a thin film has poor resistance to corrosion and deterioration, therefore, duration of life of an apparatus is highly influenced. Consequently, recently, it is further necessary to prevent a conductive layer contacting with $HNO_3$.

Further, recently, from the view point of saving energy, efficient operation of an ozone generating apparatus is performed, and performing an intermittent operation rather than a continuous operation increases. In an intermittent operation, after a certain fixed period of operation, a predetermined period of operation stopping is provided, and during the operation stopping period, gas flow is stopped, that is, operation is on standby. Depending on load conditions of an ozone utilizing facility, in some cases, the operation stopping period extends for several days to several weeks. However, reaction in which $HNO_3$ is generated from $N_2O_5$ and reaction of $HNO_3$ and a metal is comparatively quick reaction, and even during the short stopping period, in an ozone generating apparatus, $NO_x$ including the $N_2O_5$ and $HNO_3$ is desorbed and diffused, consequently, an electrode part is corroded and deteriorated. As a matter of course, even during the stopping period, by flowing constantly a material gas in an ozone generating apparatus, $NO_x$ and $HNO_3$ which is desorbed with the lapse of time can be removed to the outside of an ozone generating apparatus in real time. However, it is difficult for the user-side to accept the situation such that in spite of providing a stopping period for an efficient operation, in an ozone generating apparatus whose operation is on standby, gas is consumed and cost is generated.

This invention is made so as to solve the above-mentioned problems, and in an ozone generating system using an ozone generating apparatus having an operation standby state in which gas is sealed such as an intermittent operation and halt, this invention aims to prevent corrosion of electrode parts which is caused by $HNO_3$ (nitric acid) by considering recent apparatuses and an operation condition and reconsidering a cause thoroughly.

Means for Solving the Problems

An ozone generating system according to this invention comprises an ozone generating apparatus having discharge electrodes which are arranged facing each other so as to form a discharge space, a gas supplying device for supplying a material gas including oxygen to an ozone generating apparatus, a cooling device for supplying cooling water for cooling discharge electrodes, a power supply for supplying electricity to discharge electrodes for discharging and a control unit for controlling a gas supplying device and a power supply, and in an ozone generating system in which the control unit controls so as to perform an intermittent operation, in which an ozone generating operation period in which ozone is generated by an ozone generating apparatus by supplying a material gas from a gas supplying device to an ozone generating apparatus and by supplying electricity from a power supply to discharge electrodes and an ozone generating operation standby period in which supplying of gas from a gas supplying device to an ozone generating apparatus and supplying of electricity from a power supply to discharge electrodes is stopped are alternately repeated, the control unit controls such that the material gas is sealed in the ozone generating apparatus in an ozone generating operation standby period, and an absorbent which absorbs at least one of nitric acid and nitrogen oxide is provided at a position which is other than the discharge space in an ozone generating apparatus and where the absorbent is contacted with the material gas which is sealed.

Advantage of the Invention

According to this invention, nitric acid or nitric oxide which is diffused in an ozone generating apparatus can be removed, therefore with respect to discharge electrodes, corrosion which is caused by nitric acid can be suppressed, and as a result, a highly reliable ozone generating system can be obtained.

EMBODIMENTS FOR CARRYING OUT THE INVENTION

Figure 1:
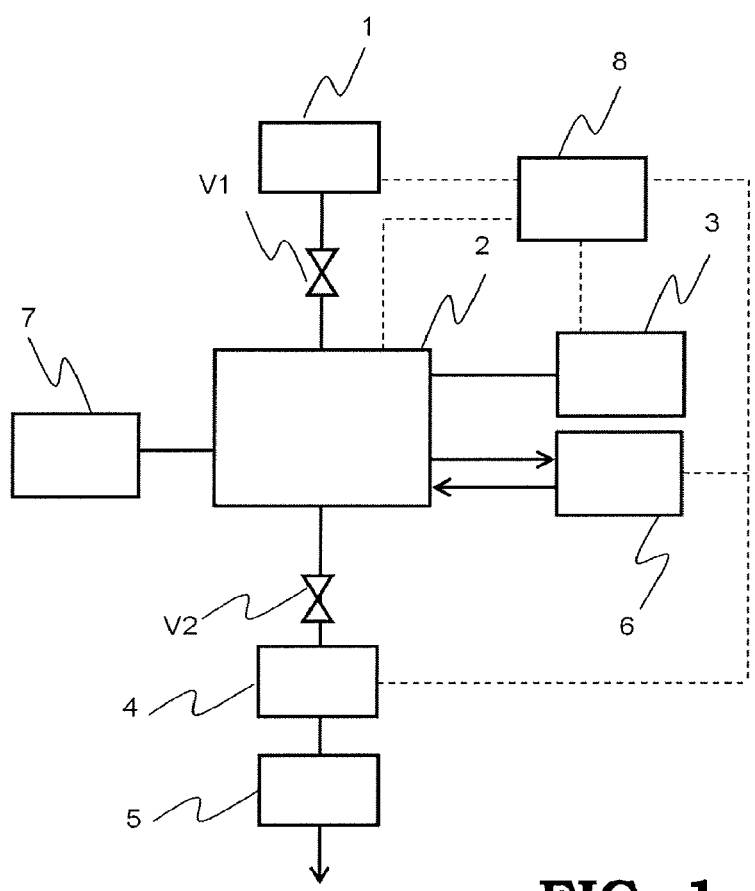
FIG. 1 is a block diagram for showing the configuration of an ozone generating system and a gas flow line according to Embodiment 1 of this invention.

First, in order to pursue a cause to generate $HNO_3$, inventors of this invention consider the following by taking an ozone generating apparatus and its operation condition in recent years into account. Some of $N_2O_5$ and $HNO_3$ which is generated in an ozone generating apparatus is absorbed by or attached to a surface of an electrode tube or an oxide film which is formed on the surface of the electrode tube. The inventors of this invention found out such that the above-mentioned can not be easily exhausted out of an ozone generating apparatus only by replacing gas in an ozone generating apparatus. According to a regular and general stopping process, adequate gas replacement is performed, for example, after the concentration of $O_3$ and $NO_x$ which is measured at a rear stage of an ozone generating apparatus reaches zero, valves of a front stage and a rear stage of an ozone generating apparatus are closed and gas flow is stopped. At that time, an ozone generating apparatus is sealed with pressure which is higher than the atmospheric pressure, therefore entering of moisture from the outside is prevented. Conventionally, it is considered such that at this time, accompanying of moisture to an ozone generating apparatus is prevented, the concentration of $NO_x$ in an ozone generating apparatus is small enough, therefore, generation of $HNO_3$ is suppressed.

However, after that, the inventors confirm such that due to change of ambient temperature, etc., with the lapse of time, in an ozone generating apparatus in which gas is sealed, $NO_x$ and $HNO_3$ is desorbed little by little from a surface of an electrode tube, and throughout the whole area of an apparatus, the concentration is diffused. In a case where gas is flowed in an ozone generating apparatus, it is found out such that at a gas entrance side of an electrode tube, $O_3$, $NO_x$ and $HNO_3$, which is produced gas, does not exist, when gas flows, the $O_3$, $NO_x$ and $HNO_3$ is exhausted to the outside of an apparatus. However, when gas is sealed in which gas flow is stopped, by the concentration diffusion under practically uniform pressure, $NO_x$ and $HNO_3$ which is desorbed exists also at a gas entrance side of an electrode tube, though in a normal operation, $NO_x$ and $HNO_3$ which is desorbed can not exist.

Conventionally, regarding corrosion in an ozone generating apparatus which is caused by $NO_x$ and $HNO_3$, as above mentioned, it is discussed assuming that an ozone generating apparatus is opened to the atmospheric air. $N_2O_5$ which is generated in an ozone generating apparatus and $HNO_3$ which is generated by moisture in the atmospheric air is a subject, therefore in an ozone generating apparatus in which gas flow is stopped, generation of corrosion which is caused by $HNO_3$ is not discussed at all. Further, it is considered that usually, only by conforming to appropriate stopping procedure, a conductive layer does not contact with produced gas in an ozone generating apparatus, therefore, it is normal not to examine the corrosion of a conductive layer which is made of a thick film, and also with regard to a conductive film which is made to be thinner which is poor in resistance, the corrosion which is caused by $HNO_3$ is not examined. Further, $HNO_3$ which is generated based on reaction with a very small amount of moisture which is contained not in the atmospheric air but in low-dew point gas is not discussed either.

As above mentioned, before an operation of the state becomes the operation standby state in which gas is sealed, increasing the temperature of an ozone generating apparatus, promoting vaporization of $N_2O_5$ which remains the inside of an ozone generating apparatus, and at the time of replacing gas, containing $N_2O_5$ and $HNO_3$ in a material gas or a purge gas from the outside and discharging is an effective means. However, in order to heat an ozone generating apparatus in a stopping state, that is, in a state in which gas is sealed and to replace gas the inside of the apparatus, energy for heating is required, and in addition to that, it is necessary to exhaust $NO_x$ and $HNO_3$ from an ozone generating apparatus. Consequently, it is necessary to fill gas again in an ozone generating apparatus whose pressure is reduced by discharging, therefore, increase of energy consumption and increase of cost can not be avoided. Further, in a case where dry gas is circulated in an ozone generating apparatus whose state is stopping state, gas which is accompanied by $NO_x$ and $HNO_3$ which is desorbed in an ozone generating apparatus is simply circulated in an ozone generating apparatus, therefore, the concentration of $NO_x$ and $HNO_3$ is diluted by dry gas and it appears to be decreased, however, it is rather such that diffusion of $NO_x$ and $HNO_3$ in an ozone generating apparatus is accelerated. Further, in a case where a gas flow controlling plug is provided at an open end which is a gas entrance side of an electrode tube, in a case where difference regarding pressure change between an ozone generating apparatus and an electrode tube is generated such as when an ozone generating apparatus is opened to the atmospheric air, entering of $NO_x$ and $HNO_3$ which is desorbed and diffused into the inside of an electrode tube is decreased, however, under the uniform pressure such as when an operation is standby, entering of gas into the inside of an electrode tube can not be suppressed. Further, gas which enters once is difficult to get away from the inside of an electrode tube, therefore, corrosion of an electrode can not be prevented.

Conventionally, regarding corrosion of a material which is caused by $N_2O_5$ and $HNO_3$, a case in which a material gas is air is discussed. In a case where a material gas is oxygen, as a matter of course, in comparison with a case in which a material gas is air, an amount of nitrogen component in a material gas is less, and an amount of $NO_x$ to be produced is greatly reduced. Consequently, the issue of corrosion of an electrode which is caused by $N_2O_5$ and $HNO_3$ is treated as a specific issue in a case where a material gas is air. However, $N_2O_5$ which is by-produced in an ozone generating apparatus also easily reacts with a very little amount of moisture which is accompanied by a material gas so as to produce $HNO_3$, the inventors of this invention found out such that not only in a case where a material gas is air, but also in an ozone generating operation standby period in a case where a material gas is oxygen, which is generated using PSA (Pressure Swing Adsorption) type oxygen generating device or VPSA (Vacuum Pressure Swing Adsorption) type oxygen generating device, whose purity is comparatively low (purity is 90-95%) in comparison with liquid oxygen and oxygen bomb, same phenomena as that in a case where a material gas is air occurs. In this connection, in a case where a material gas is liquid oxygen, generally, 0.1 to 1% of nitrogen with respect to an amount of flow of liquid oxygen is accompanied, and when the accompanying amount of nitrogen is the above-mentioned, in an ozone generating operation standby period, the above-mentioned problems are not frequently generated.

Based on the consideration such that $NO_x$ and $HNO_3$ which are desorbed are diffused at the time of operation standby period as above mentioned, mainly from the view of preventing diffusion of $NO_x$ and $HNO_3$, this invention is made. Hereinafter, this invention will be described by showing Embodiments.

Embodiment 1

Figures 2A, 2B:
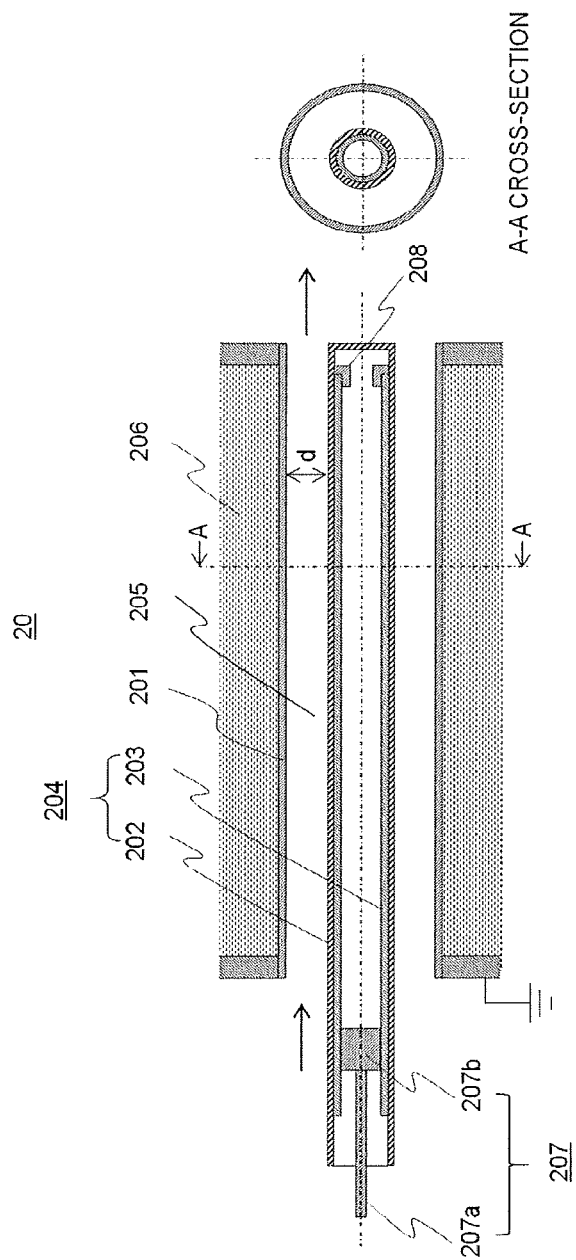
FIGS. 2A and 2B are cross-sectional views showing the configuration of a discharge electrode part in an ozone generating apparatus in an ozone generating system according to Embodiment 1 of this invention.
Figure 3:
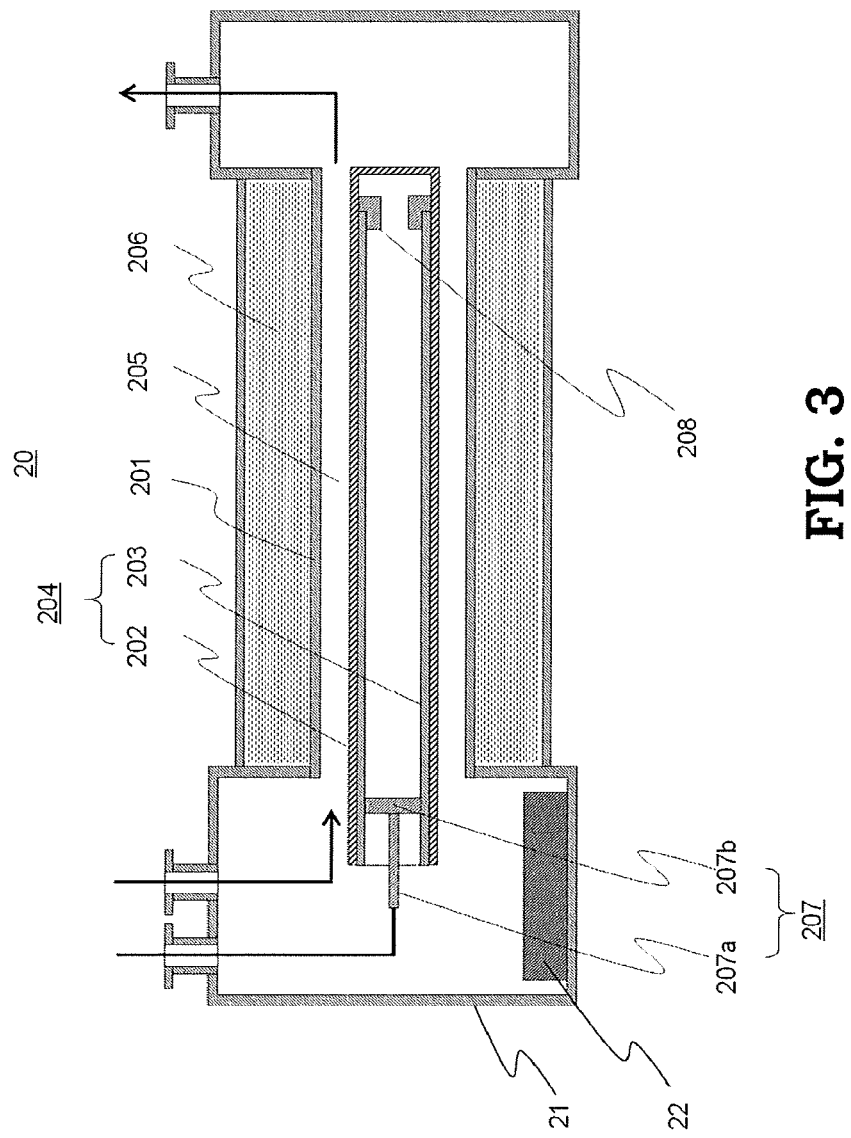
FIG. 3 is a cross-sectional view showing the configuration of an ozone generating apparatus in an ozone generating system according to Embodiment 1 of this invention.

FIGS. 1 to 3 are figures for describing an ozone generating system and its operation method according to Embodiment 1, FIG. 1 is a block diagram showing a configuration of an ozone generating system and its flow line, FIGS. 2A and 2B are cross-sectional views showing the configuration of a discharge electrode part in an ozone generating apparatus, FIG. 2A is a cross-sectional view of a cut section of a discharge electrode part which is parallel to a direction of a gas flow, and FIG. 2B is a cross-sectional view of a discharge electrode part which is perpendicular to a direction of gas flow, taken along the line of A-A in FIG. 2A. FIG. 3 is a cross-sectional view showing the configuration of an ozone generating apparatus.

The configuration of an ozone generating system according to Embodiment 1 will be described. As shown in FIG. 1, an ozone generating system comprises a gas supplying device 1 for supplying a material gas, an ozone generating apparatus 2 in which ozone is generated from a material gas which is supplied from the gas supplying device 1 so as to output ozonized gas, a power supply 3 for applying an AC high voltage to the ozone generating apparatus 2, an ozone-utilizing facility 4 in which ozone treatment is performed by using ozonized gas which is outputted, a waste ozone treatment unit 5 in which ozone is removed from excess ozonized gas which is exhausted from the ozone-utilizing facility 4, a cooling device 6 for circulating cooling water for cooling the ozone generating apparatus 2, a safety valve 7 which is opened when gas pressure in the ozone generating apparatus 2 is higher than a predetermined value and a control unit 8 for controlling all of the above-mentioned so as to manage an ozone generating system. Further, a broken line in FIG. 1 shows a typical control line.

In a case where air is used as a material gas of the ozone generating apparatus 2, the gas supplying device 1 is a compressor or a blower, and in a case where oxygen is used as a material gas, the gas supplying device 1 is PSA-type or VPSA-type oxygen generating device. Further, when a compressor or a blower is used, as needed, a moisture removing unit comprising a material gas cooling/drying device is provided. Regarding the moisture removing unit, a heating regeneration type or a pressure regeneration type is used. Regarding a material gas, as gas containing oxygen, pressurized air or oxygen gas which is generated by an oxygen generating device is applied to the ozone generating apparatus 2. The ozone-utilizing facility 4 includes a water treatment facility, a waste water treatment facility, various kinds of oxidation treatment facility, and a semiconductor/liquid crystal manufacturing facility, etc.

The cooling device 6 comprises a circulating pump for circulating cooling water for cooling the ozone generating apparatus 2 and a cooling device for cooling the cooling water whose temperature is increased by absorbing heat which is generated by the ozone generating apparatus 2. As a cooling device, various kinds of heat exchange type cooling device including a liquid-liquid type and liquid-gas type or liquid-fluorocarbon refrigerant type chiller, etc. can be used. In many cases, general tap water is used as cooling water, however, in some cases, an anti-freezing fluid or water in which a scale remover is mixed, or ion exchanged water or pure water is used.

In the above-mentioned ozone generating system, based on a request command from the ozone-utilizing facility 4, via the control unit 8, an operation of the ozone generating apparatus 2 is controlled so as to perform an intermittent operation. When the ozone generating apparatus 2 receives an operation command, a material gas is supplied from the gas supplying device 1. When a material gas is supplied, a gas dew point in the ozone generating apparatus 2 is lower than −50 degrees centigrade, and when pressure in the ozone generating apparatus 2 is maintained at a predetermined operation pressure, cooling water from the cooling device 6 is circulated in the ozone generating apparatus 2 and electricity is supplied from a power supply to discharge electrodes so as to start generating ozone. On the other hand, when the ozone generating apparatus 2 receives a stop command, supplying electricity from a power supply to discharge electrodes is stopped and ozone generation is stopped, after gas in the ozone generating apparatus 2 is adequately replaced by using a material gas, the ozone generating apparatus 2 is sealed by gas so as to make the pressure in the ozone generating apparatus 2 to be higher than the atmospheric pressure at least, preferably, to be lower than structural pressure resistance of the ozone generating apparatus 2 and set pressure of the safety valve 7 and higher than operation gas pressure of the ozone generating apparatus 2. After that, an operation of the gas supplying device 1 and the cooling device 6 is stopped. As above mentioned, based on user's request, ozone generation, and an operation and stopping of peripheral facility is repeated, consequently, an ozone generating system can be efficiently managed.

Next, the configuration of the ozone generating apparatus 2 according to Embodiment 1 will be described. The ozone generating apparatus 2 is a silent discharge type ozone generating apparatus which comprises discharge electrodes arranged facing each other so as to form a discharge space and which performs discharging via a dielectric between the discharge electrodes. Regarding an electrode shape, any shape such as a parallel plate, cylindrical tube type, etc. can be applied, however, here, as shown in FIG. 2, as a discharge electrode part 20 of the ozone generating apparatus 2, an ozone generating apparatus having a cylindrical tube type electrode will be described as an example. In the discharge electrode part 20, a high voltage electrode tube 204, comprising a high voltage electrode (conductive layer) 203 having a cylindrical shape as an electrode at a high voltage side and a dielectric tube 202 which is made of glass tube which is integrated with the high voltage electrode 203 so as to cover a circumferential surface of the high voltage electrode 203 and one end side, is provided. Regarding the high voltage electrode tube 204, the one end is sealed so as for a material gas to flow only the discharge space which will be described later, and not for gas to pass the inside of the high voltage electrode tube 204. As a great amount of $O_3$ or $NO_x$ which is generated by discharge exists at downstream of gas flow direction, one end at downstream is sealed so as for the $O_3$, etc., not to enter inside of the high voltage electrode tube 204. Further, an outer diameter of the high voltage electrode tube 204 is 30 mm or less. The high voltage electrode 203 is a metallic thin film and is made of aluminum, chromium, titanium, nickel or an alloy containing the above-mentioned, stainless, etc. Then, as an electrode at a ground side, the ground electrode tube 201 is provided so as for an inner surface of the ground electrode tube 201 and a circumferential surface of the high voltage electrode tube 204 to face each other with a predetermined distance (=cavity length, d) (which will be described later) with respect to a circumferential surface of the high voltage electrode tube 204 and is arranged so as to be coaxial with the high voltage electrode tube 204 and so as for cooling water 206 to flow in the circumference.

A gap between a circumferential surface of the dielectric tube 202 and an inner circumferential surface of the ground electrode tube 201 is a discharge space 205. The discharge space 205 is gas flow passage for flowing a material gas to the direction which is indicated by an arrow in FIG, and is space for generating discharge by an AC high voltage which is applied between the ground electrode tube 201 and the high voltage electrode tube 204. Further, in the high voltage electrode tube 204, a power feed member 207 for applying a high voltage to the high voltage electrode 203 is inserted from other end side which is opened, at an end of one side which is covered with the dielectric tube 202, an electric field relaxation layer 208 for suppressing surface discharge is provided. The power feed member 207 is contacted with the high voltage electrode 203 at an outer side of the ground electrode tube 201 so as for arc not to being maintained when a short between electrodes is generated. Further, in a sectional view of FIG. 2B, description of the power feed member 207 is omitted.

In the ozone generating apparatus 2, many of the above-mentioned discharge electrode parts 20 are arranged in parallel corresponding to necessary amount of ozone generation so as to be stored in one tank. Then, the ozone generating apparatus 2 comprises the power supply 3 for applying an AC high voltage, by the power supply 3 which is controlled by the control unit 8, a predetermined AC voltage is applied to each of the discharge electrode part 20. In the discharge space 205 of each of the discharge electrode part 20, a material gas containing oxygen is supplied from the gas supplying device 1, an AC high voltage is applied via the power feed member 207 and ozone is generated by discharging of a material gas.

Next, the configuration and operation condition of the ozone generating apparatus 2, which is suitable for a material gas being gas containing oxygen, which is common to an ozone generating system according to Embodiment 1 and subsequent Embodiments will be described. Regarding the configuration of the discharge electrode part 20 according to each Embodiment, a gap length d of the discharge space 205 is set to be 0.1 mm or more and to be 0.6 mm or less, preferably, is set to be 0.2 mm or more and to be 0.6 mm or less. When a gap length d is set to be 0.6 mm or less, in comparison with an ozone generating apparatus whose gap length exceeds 0.6 mm, cooling efficiency of the discharge space 205 is improved, and ozone generation efficiency is increased, on the other hand, electric field intensity of the discharge space 205 is increased, consequently, a generation amount of $NO_x$ which is by-produced is increased. In a case where a material gas is air, when a gap length d is set to be less than 0.3 mm, electric field intensity of the discharge space 205 is excessively increased, a generation amount of $NO_x$ is remarkably increased, as a result, ozone generation efficiency is decreased, that is, it is not preferable. Further, in a case where a material gas is rich in oxygen, generation of higher concentration ozone is required, and in comparison with a case in which a material gas is air, a generation amount of $NO_x$ is decreased, consequently, a gap length which is shorter can be adopted. From the view point of manufacturing technology for forming a uniform gap length d, a gap length d of 0.1 mm is close to its limit, and it is preferable to set a gap length d to be 0.2 mm or more. Further, when a gap length d is set to a value which exceeds 0.6 mm, the temperature of the discharge space 205 is excessively increased, consequently, ozone generation efficiency is decreased.

Further, ozone generation efficiency is changed not only by a gap length d but also by gas pressure P in the discharge space 205. Regarding operation conditions of an ozone generating system according to each Embodiment, gas pressure P is set to be 0.2 MPaG (G: gauge pressure) or less, preferably, gas pressure P is set to be 0.05 MPaG or more and to be less than 0.2 MPaG, more preferably, gas pressure P is set to be 0.1 MPaG or more and to be less than 0.2 MPaG. Especially, in a case where a material gas is air, increase of gas pressure P suppresses the generation of NOx in the discharge space 205. Further, lower and upper limitations of gas pressure P are determined by a discharge pressure of the gas supplying device 1, for example, in a case of a blower, maximum discharge pressure is 0.2 MPaG or so, and also by ozonized gas pressure which is necessary for the ozone-utilizing facility 4 (in a case of water treatment device, a gas pressure P is at least 0.05 MPa or more). Further, by setting gas pressure P to be less than 0.2 MPaG, the ozone generating apparatus 2 does not fall within the class-2 pressure vessels provision, consequently, legal requirement of limitation is alleviated, therefore, handling, etc. will be easier.

That is, in each Embodiment, by setting a gap length d to be 0.1 mm or more and to be 0.6 mm or less, in a case where a material gas is air, by setting a gap length d to be 0.3 mm or more and to be 0.6 mm or less, in a case where a material gas is rich in oxygen such as a case in which using an oxygen generating apparatus is used, by setting a gap length d to be 0.1 mm or more and to be 0.3 mm or less, and further by adjusting gas pressure P, corresponding to a type of material gas and an ozone generation concentration which is required, the configuration, by which ozone generation efficiency is made to be the highest and generation amount of $NO_x$ is decreased, is adapted.

It is preferable such that input power density (input power per an electrode area) which is inputted to the ozone generating apparatus 2 is in a range of 0.05 to 0.6 W/cm², in a case where a material gas is air, input power density is 0.1 W/cm² or more and is 0.4 W/cm² or less, in a case where a material gas is rich in oxygen such as a case in which an oxygen generating device is used, input power density is 0.3 W/cm² or more and is 0.6 W/cm² or less. Input power density is an index for indicating a size of the ozone generating apparatus 2, and when input power density is larger, a size of apparatus is smaller. On the other hand, when input power density is increased, the temperature of the discharge space 205 is increased, as a result, ozone generation efficiency is deceased. From a view of generation of ozone and suppressing generation of nitric oxide, it is preferable such that the temperature of the discharge space 205 is lower, consequently, it is necessary for input power density not to be excessively increased. However, when input power density is less than 0.05 W/cm², a discharge state is dispersed, stable discharge can not be maintained, and it is not preferable.

Next, a phenomenon which occurs in the ozone generating apparatus 2 having the above-mentioned configuration under the above-mentioned operation conditions and problems which occur in conventional ozone generating systems will be described. An operation in a case where an ozone generating apparatus is intermittently operated in conventional ozone generating systems will be described. The ozone-utilizing facility 4 transmits an operation (ozone generation) command to the ozone generating apparatus 2 together with a necessary ozone generation amount. When the ozone generating apparatus 2 receives an ozone generation command, among valves V1 and V2 which have been closed, the valve V1 is opened, and a material gas is introduced from the gas supplying device 1 to the ozone generating apparatus 2. At a stage where pressure in the ozone generating apparatus 2 is increased to be a predetermined pressure which is higher than the atmospheric pressure, the valve V2 is opened. After that, cooling water having a predetermined flow rate is introduced from the cooling device 6, and when a gas dew-point in the ozone generating apparatus 2 is −50 degrees centigrade or lower, electricity is supplied from the power supply 3 and ozone generation is performed for a predetermined time. The above-mentioned state refers to an ozone generating operation period. On the other hand, when the ozone generating apparatus 2 receives an operation standby (stopping of ozone generation) command from the ozone-utilizing facility 4, or receives a signal which indicates such that an operation time reaches a predetermined operation time which is determined by the control unit 8, supplying of electricity from the power supply 3 to discharge electrodes is stopped, ozone generation is stopped, after that, supplying of cooling water is stopped.

In a stopping step, in order to exhaust $O_3$ and $HNO_3$ which is produced gas from the ozone generating apparatus 2, gas in the ozone generating apparatus 2 is replaced by using a material gas for a predetermined time (depending on volume of an ozone generating apparatus and gas flow rate, in general, time of thirty minutes to one hour is necessary), or until a value which is indicated by an ozone concentration meter in the ozone generating apparatus 2 becomes zero. At the point when it is judged such that gas in the ozone generating apparatus 2 is adequately replaced, the valves V1 and V2 are closed so as to maintain the pressure in the ozone generating apparatus 2 to be higher than the atmospheric pressure, and supplying of a material gas is stopped. Here, an intermittent operation, that is, an operation is stopped and then is restarted, is the premise, consequently, regarding the gas supplying device 1 and the cooling device 6, only an operation of a pump and a compressor have to be stopped, and main power supply may be maintain power-on. The above-mentioned state refers to an ozone generating operation standby period. When a predetermined ozone generating operation standby period is passed, or when an ozone generation command from the ozone-utilizing facility 4 is received, supplying of a material gas is started, the valves V1 and V2 are opened, and again, an ozone generating operation period is repeated. By repeating the above-mentioned ozone generating operation period and ozone generating operation standby period, an intermittent operation is performed. Setting of an ozone generating operation period and an ozone generating operation standby period is made based on user's request, consequently, in some system conditions, a period of an ozone generating operation is short. There is also a case in which the valves V1 and V2 are closed without securing adequate time for discharging produced gas from the ozone generating apparatus 2. Conversely, in some cases, a length of an ozone generating operation standby period is extremely long, that is, a length of an ozone generating operation standby period extends for several weeks.

Conventionally, regarding an intermittent operation in an ozone generating system, before an ozone generating operation period starts, gas in an ozone generating apparatus is adequately replaced by using a material gas, therefore, it is not considered such that a produced gas including $O_3$, NOx and $HNO_3$ flows backward from a downstream side (a gas exit side) to an upstream side (a gas entrance side) of an ozone generating apparatus and enters an inside of a high voltage electrode tube. It is considered such that generally, gas replacement is adequately performed, therefore, $O_3$, $NO_x$ and $HNO_3$ does not remain in an ozone generating apparatus. However, in the ozone generating apparatus 2, in an interior surface of the ground electrode tube 201, in an exterior surface of the high voltage electrode 203 and in an inner wall surface of a tank of the ozone generating apparatus 2, $NO_x$ and $HNO_3$ is absorbed, attached and remains. Especially, in an interior surface of a ground electrode tube and in an exterior surface of a high voltage electrode, an oxide, which is generated by oxidation and sputtering of a stainless steel which is a material of a ground electrode tube, is deposited, and it is found out such that $NO_x$ and $HNO_3$ which is absorbed in the above-mentioned oxide can not be easily exhausted to the outside of the ozone generating apparatus 2 even by performing gas replacement for a long time.

$NO_x$ and $HNO_3$ in the oxide is gradually desorbed by influence of ambient temperature, etc., therefore, even in an ozone generating operation standby period, when supplying of a material gas is continued and gas flows in the ozone generating apparatus 2, $NO_x$ and $HNO_3$ which is desorbed is exhausted to the outside of the ozone generating apparatus 2, each time. However, an ozone generating operation standby period is the state where gas is sealed, the inside of the ozone generating apparatus 2 is uniform pressure space, and gas does not flow. Consequently, inventors of this invention found out such that $NO_x$ and $HNO_3$ which is gradually desorbed is not exhausted to the outside of the ozone generating apparatus 2, in the ozone generating apparatus 2 whose pressure is uniform, the concentration diffusion is generated over the whole area of the apparatus, therefore, $NO_x$ and $HNO_3$ exists also at a material gas entrance side of the ozone generating apparatus 2, though conventionally, it is not considered such that $NO_x$ and $HNO_3$ exists at a material gas entrance side of the ozone generating apparatus 2. For example, it is confirmed such that in a case of an ozone generating apparatus using air as a material gas, approximately several thousand ppm of $NO_x$ is generated together with $O_3$, most of the above-mentioned is exhausted to the outside of the ozone generating apparatus 2 by gas replacement, however, by passing several hours to several days of ozone generating operation standby period, approximately several hundreds ppm of $NO_x$ is diffused and remains over the whole area of the ozone generating apparatus 2.

Understandably, the $NO_x$ enters the inside of the high voltage electrode tube 204 whose material gas entrance side is an open end. At a position where $NO_x$ exists, at the same time, $HNO_3$, which is generated by reacting with a very small amount of moisture, exists. $NO_x$ and $HNO_3$ which enters the inside of the high voltage electrode tube 204 is trapped by the power feed member 207 which is provided in the high voltage electrode tube 204, and is concentrated on a surface of the power feed member 207. $NO_x$ and $HNO_3$ which is concentrated moves on a surface of the power feed member 207 so as to act on the high voltage electrode tube 203 on which the power feed member 207 is contacted. As a result, a part, where the power feed member 207 and the high voltage electrode tube 203 are contacted, is rapidly corroded, and is deteriorated by an oxidizing reaction. Regarding a part where the high voltage electrode tube 203 is contacted which is deteriorated by an oxidizing reaction, an electrical resistivity increases, therefore, when an ozone generating operation period starts again, that is, at an instant when electricity is supplied, the part where the high voltage electrode tube 203 is contacted disappears due to Joule heat. Due to disappearance of the high voltage electrode tube 203, supplying of electricity to the high voltage electrode tube 204 is stopped. Consequently, the high voltage electrode tube 204 does not contribute to ozone generation.

According to the above-mentioned events, in a conventional ozone generating apparatus in a case where an amount of nitrogen which is contained in a material gas is not negligible, that is, in a case where a material gas is air, or in a case where an oxygen generating device such as VPSA is used, when an ozone generating operation standby period is completed, and again, an ozone generating operation period starts, some electrode tubes do not contribute to ozone generation, and consequently, ozone generation efficiency is decreased. Then, in an ozone generating apparatus according to Embodiment 1 of this invention, based on the following configuration and operation, diffusion of $NO_x$ and $HNO_3$ in an ozone generating operation standby period is suppressed, corrosion which is caused by $NO_x$ and $HNO_3$ of the high voltage electrode 203 which is provided in an interior surface of the high voltage electrode tube 204 is prevented.

FIG. 3 is a cross-sectional view showing the overall configuration of an ozone generating apparatus 2 according to Embodiment 1 of this invention. For simplification of Figure, in FIG. 3, only one set of discharge electrode part 20 is depicted, however, in actual, a plurality of discharge electrode parts 20 are provided in parallel and connected. In a bottom of a header at a material gas side 21, an absorbent 22 is provided. The absorbent 22 is a dry type material which can absorb at least one of $NO_x$ (nitrogen oxide) and $HNO_3$ (nitric acid) and pellet-shaped zeolite is used. As above mentioned, $HNO_3$ is generated from $NO_x$, ultimately, $HNO_3$ causes corrosion of the high voltage electrode 203, and therefore, by decreasing at least one of concentration of $NO_x$ and $HNO_3$, corrosion can be suppressed. However, needless to say, it is more preferable such that the absorbent 22 is a dry type material which can absorb both of $NO_x$ and $HNO_3$.

According to Embodiment 1 of this invention, when the ozone generating apparatus 2 in an ozone generating operation period receives an operation standby command (ozone generation stop) from the ozone-utilizing facility 4 or receives a signal which indicates such that an operation time reaches a predetermined operation time which is determined by the control unit 8, ozone generation is stopped, after that, supplying of cooling water is stopped. Further, in order to exhaust $O_3$, $NO_x$ and $HNO_3$ which is produced gas from the ozone generating apparatus 2, gas in the ozone generating apparatus 2 is replaced by using a material gas for a predetermined time or until a value which is indicated by an ozone concentration meter in the ozone generating apparatus 2 becomes zero. At the point when it is judged such that the gas in the ozone generating apparatus 2 is adequately replaced, the gas pressure and temperature in the ozone generating apparatus 2 is substantially uniform, the valves V1 and V2 are closed so as to maintain the gas pressure in the ozone generating apparatus 2 to be higher than the operation gas pressure P at least, that is, so as to maintain the gas pressure in the ozone generating apparatus 2 to be higher than the pressure in an ozone generating operation period and less than set pressure of the safety valve 7, supplying of a material gas is stopped, and a period is shifted to an ozone generating operation standby period. In an ozone generating operation standby period, $NO_x$ and $HNO_3$, which is absorbed on a surface of an electrode tube in a discharge space in an ozone generating operation period, begins to be desorbed gradually. Main driving force of desorption includes a temperature gradient or a gas concentration gradient to be objective, for example, due to change of an ambient temperature of the ozone generating apparatus 2, $NO_x$ and $HNO_3$ is desorbed from a surface of an electrode tube, etc. Due to the concentration diffusion, $NO_x$ and $HNO_3$ which is desorbed is diffused to space where $NO_x$ and $HNO_3$ does not exist. $NO_x$ and $HNO_3$ which is diffused from the discharge space to the header 21 at a material gas side is heavier than oxygen or air, therefore, mostly, $NO_x$ and $HNO_3$ begins to be accumulated in a bottom of the header 21. In a bottom of the header 21, the absorbent 22 is provided, the absorbent 22 and $NO_x$ and $HNO_3$ which is diffused is contacted in a bottom of the header 21, and at least one of $NO_x$ and $HNO_3$ is absorbed and removed from the ozone generating apparatus 2. Consequently, entering of $NO_x$ and $HNO_3$ which is diffused from an open end of the high voltage electrode tube 204 can be greatly suppressed, as a result, the high voltage electrode tube 203 will not be corroded and degraded due to contact with $NO_x$ and $HNO_3$.

As the absorbent 22, zeolite, alumina, an alkali neutralizer including calcium hydroxide and sodium hydroxide, or mixture thereof may be used. Regarding the property of the absorbent 22, a chemical adsorbent type is preferable, however, in an ozone generation operation standby period, energy which is necessary for desorbing $NO_x$ and $HNO_3$ from a surface of an electrode tube (temperature change, etc.) is not sharply applied to the ozone generating apparatus 2, therefore, a physical adsorbent type is acceptable. Further, the structure of the absorbent 22 is either granular-type, pellet-shaped or powdery, and the absorbent 22 may be directly provided in a bottom of the header at a material gas side 21, or the absorbent 22 which is covered with nonwoven fabric or a porous material may be provided in a bottom of the header at a material gas side 21. Especially, in a case where the absorbent 22 is fine powder, when a material gas is introduced, there is the possibility such that the powder may flutter down, and is introduced to the discharge space together with a material gas. When the absorbent is covered with nonwoven fabric or a porous material, the power of the absorbent will not be introduced to the discharge space. Regarding an installation site of an absorbent, any place which is in an ozone generating apparatus other than the discharge space and is contacted with gas is acceptable, and in order to avoid being exposed to ozone during an ozone generating operation period, it is preferable such that an absorbent is provided at a side which is closer to a supplying side of a material gas than the discharge space such as the header at a material gas side 21.

In an appropriate operation condition, ozone is not introduced to the header 21 at a material gas side, however, in a case where an activated charcoal type absorbent 22 is used, in order to respond to a nonstationary state in which ozone is unexpectedly mixed, from the view point of avoiding rapid temperature rising or explosion associated with decomposing of ozone, it is preferable to use a specified activated charcoal which is treated with an alumina, etc.

Further, in an ozone generating operation standby period, diffusion of $NO_x$ and $HNO_3$ which is desorbed in the ozone generating apparatus 2 to the ozone generating apparatus 2 also depends on gas pressure in the ozone generating apparatus 2. In the ozone generating apparatus 2, an amount of $NO_x$ and $HNO_3$ which moves on a unit area in a unit time, that is, diffusion flow velocity becomes smaller when gas pressure in the ozone generating apparatus 2 is higher. In conventional ozone generating apparatuses, gas pressure in an ozone generating operation standby period is determined based on the view such that gas pressure is acceptable as long as an apparatus is not opened to the atmospheric pressure, therefore, generally, a value of gas pressure is lower than operation gas pressure P. According to this invention, when a period is shifted from an ozone generating operation period to an ozone generating operation standby period, gas pressure in the ozone generating apparatus 2 is increased higher than operation gas pressure P (pressure when $NO_x$ or $HNO_3$ is absorbed), therefore, diffusion flow velocity of $NO_x$ and $HNO_3$ in an ozone generating operation standby period can be decreased. That is, in an ozone generating operation standby period, the probability of existence of $NO_x$ and $HNO_3$ in the header at a material gas side 21 can be decreased. In an ozone generating operation standby period, gas pressure is only increased higher than operation gas pressure in an ozone generating operation period, therefore, it is easy to control the ozone generating apparatus 2.

By utilizing cooling water for circulating in the ozone generating apparatus 2 or a thermoregulatory which is provided in an ozone generating system so as to control a temperature of the ozone generating apparatus 2, for example, controlling desorption of $NO_x$ and $HNO_3$ from an oxide film which is formed on a surface of an electrode tube is an effective means. For example, in an ozone generating operation standby period, while keeping the circulation of cooling water in the ozone generating apparatus 2, by decreasing a temperature of the ozone generating apparatus 2, desorption of $NO_x$ and $HNO_3$, that is, diffusion can be suppressed. On the other hand, before a period is shifted to an ozone generating operation standby period, by increasing a temperature of the ozone generating apparatus 2, desorption speed of $NO_x$ and $HNO_3$ can be improved, and before a period is shifted to an ozone generating operation standby period, $NO_x$ and $HNO_3$ can be exhausted together with a material gas as much as possible. However, the above-mentioned means is not preferable because attached facilities for controlling temperature, energy and cost are added. An intermittent operation of the ozone generating apparatus 2 is an efficient operation condition which aims to realize saving energy and low cost, and to the ozone generating apparatus 2 in an ozone generating operation standby period which is provided for suppressing energy consumption, inputting energy and cost for other than ozone generation goes against the idea of employing an intermittent operation.

Regarding diffusion of $NO_x$ and $HNO_3$ in an ozone generating operation standby period, when a gap length is 0.6 mm or less, diffusion of $NO_x$ and $HNO_3$ is remarkably generated. In the ozone generating apparatus 2 according to Embodiment 1, in comparison with a conventional ozone generating apparatus whose gap length exceeds 0.6 mm, field intensity of the discharge space 205 is increased, and therefore, a generation amount of $NO_x$ itself is increased. Consequently, $NO_x$ which is accumulated on a surface of an electrode tube is also increased. That is, removing of $NO_x$ or $HNO_3$ using the absorbent 22 which is provided in a bottom of the header 21 at a material gas side is extremely effective in an ozone generating apparatus whose gap length is set to be short as in that of Embodiment 1. Further, when a diameter of an electrode tube is reduced in order to realize the miniaturization of the ozone generating apparatus 2, it is inevitably such that the high voltage electrode 203 inside the ozone generating apparatus 2 is a thin film, therefore, the miniaturization is a factor for the high voltage electrode 203 to be susceptible to $NO_x$ or $HNO_3$. Conventionally, an electrode tube having a large diameter such as about 100 mm is used, therefore, as the high voltage electrode 203, a thick film whose adhesion is extremely high and thickness of a film is 100 μm or more can be formed by thermal spraying, etc. However, in Embodiment 1 of this invention, an electrode tube whose diameter is 30 mm or less is used, therefore the construction technique such as flame spray can not be adopted. Regarding an electrode tube whose diameter is 30 mm or less, a wet type coating, metal plating, vacuum deposition, etc. is adopted as the construction technique, and a thin film whose thickness is several μm or less can be formed as the high voltage electrode 203. Therefore, corrosion resistance against $NO_x$ or $HNO_3$ is decreased in comparison with a high voltage electrode having a thicker film. Consequently, removing of $NO_x$ or $HNO_3$ by using the absorbed 22 which is provided in a bottom of the header 21 at a material gas side in Embodiment 1 is extremely effective from the view point of reducing a diameter of an electrode tube.

As above mentioned, according to an ozone generating system in Embodiment 1, in an ozone generating operation standby period of an intermittent operation, the absorbent 22 which is provided in the header 21 at a material gas side absorbs $NO_x$ and $HNO_3$ which is diffused in the ozone generating apparatus 2 from gas which is sealed in the ozone generating apparatus 2, therefore entering of $NO_x$ or $HNO_3$ to inside of the high voltage electrode tube 204 whose one end is an open end can be greatly suppressed. Consequently, the high voltage electrode 203 will not be corroded and degraded, therefore a highly reliable intermittent operation can be provided. Further, by setting gas pressure in the ozone generating apparatus 2 in an ozone generating operation standby period to be larger than operation gas pressure, diffusion flow velocity of $NO_x$ and $HNO_3$ can be decreased. Consequently, the probability of existence of $NO_x$ and $HNO_3$ in the header 21 at a material gas side can be decreased.

Embodiment 2

Figure 4:
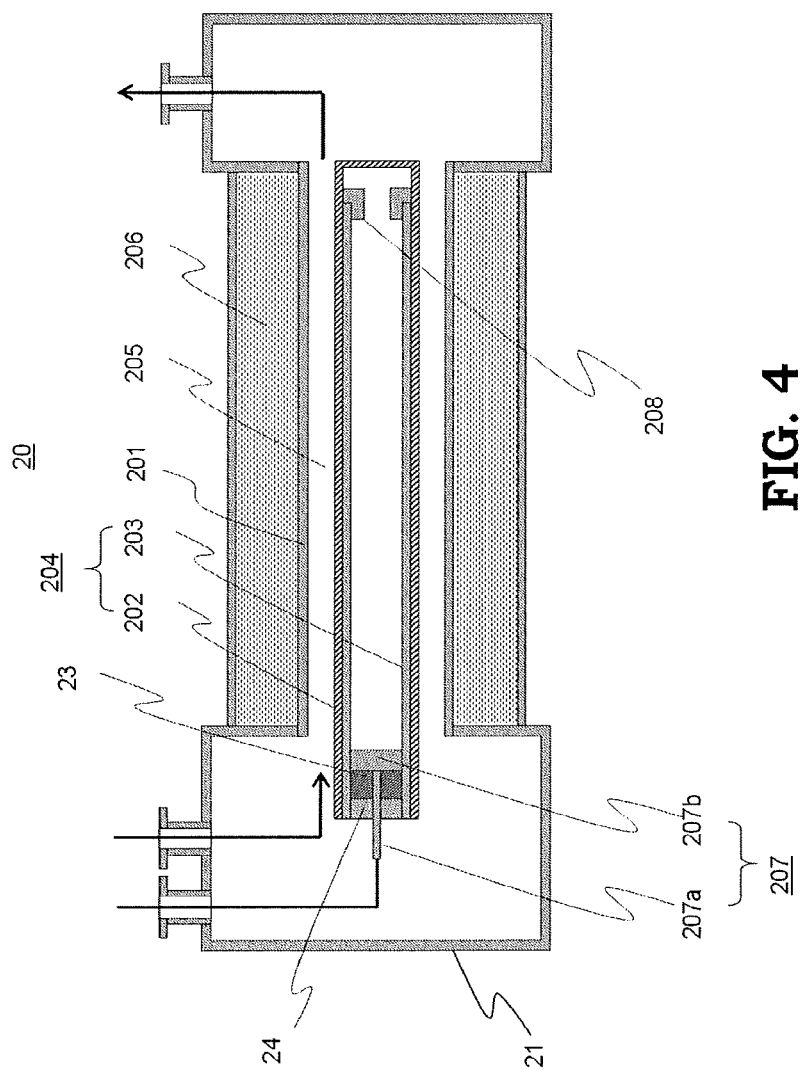
FIG. 4 is a cross-sectional view showing the configuration of an ozone generating apparatus in an ozone generating system according to Embodiment 2 of this invention.
Figure 5:
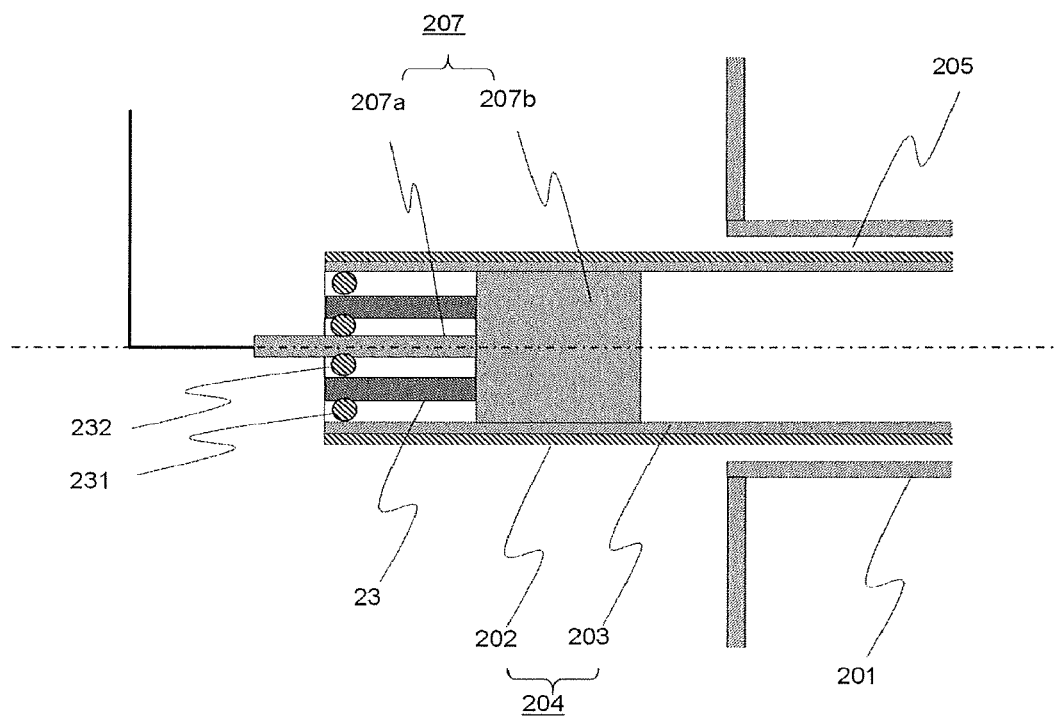
FIG. 5 is an expanded cross-sectional view showing one example of configuration of a principal part of an ozone generating apparatus in an ozone generating system according to Embodiment 2 of this invention.

An ozone generating system according to Embodiment 2 of this invention will be described. A basic configuration and operation of an ozone generating system according to Embodiment 2 is same as that of an ozone generating system according to Embodiment 1, however, an installation site of an absorbent which is provided in an ozone generating apparatus is different. FIG. 4 is a view showing the overall configuration of an ozone generating apparatus according to Embodiment 2 of this invention and is a cross-sectional view in a cut section which is parallel to gas flow direction in a discharge electrode part. For simplification of Figure, in FIG. 4, only one set of discharge electrode part 20 is depicted, however, in actual, a plurality of discharge electrode parts are provided in parallel and connected. FIG. 5 shows one example of configuration of an open end part of a high voltage electrode tube of an ozone generating apparatus according to Embodiment 2 in a cut section which is parallel to gas flow direction in a discharge electrode part. In the same way as that of FIGS. 2 and 3, in FIG. 5, a part which is same as or corresponding to the configuration of an ozone generating system according to Embodiment 1 will be given same reference character, and description will be omitted unless it is particularly required.

By comparing with case of Embodiment 1, only different points will be described in the following. In Embodiment 2 of this invention, an absorbent 23 which removes at least one of $NO_x$ and $HNO_3$ which is desorbed in an ozone generating operation standby period in an intermittent operation and is diffused in an ozone generating apparatus 2 from gas which is sealed in the ozone generating apparatus 2 with pressure which is higher than operation gas pressure P at least is provided in space which is formed between an open end of a high voltage electrode tube 204 and a contact part 207b of a feed member 207. That is, a core bar 207a penetrates through the absorbent 23. This space is non-discharge space, therefore, the absorbent 23 is not affected by discharge. The absorbent 23 may be filled alone in the high voltage electrode tube 204 and also may be covered with nonwoven fabric or a porous material so as to be provided. In a case where the absorbent 23 which is pellet-shaped, granular or powdery is filled alone in space inside the high voltage electrode tube 204, a glass wool material 24 is filled in an open end so as not for the absorbent 23 to be leaked from an open end of the high voltage electrode tube 204. The above-mentioned is not limited to a glass wool material, any material which has the configuration in which the absorbent 23 is not leaked and gas is penetrated is acceptable.

Further, regarding the configuration of the absorbent 23, the configuration in which gas can be penetrated inside the absorbent, for example, the configuration which is formed to be honeycomb is acceptable. In this case, as shown in FIG. 5, via a gas sealing material 231 and 232 such as O-rings, by contacting the absorbent 23 with the high voltage electrode 203 and the core bar 207a of the feed member 207, an absorbent can be provided at an open part of the high voltage electrode tube 204. According to the above-mentioned configuration, NOx and HNO$_3$ which does not pass through an absorbent and enters into the inside of the high voltage electrode tube 204 can be suppressed, therefore, NO$_x$ and HNO$_3$ can be effectively absorbed and removed. Further, the feed member 207 and the absorbent 23 is integrated, therefore, assembling electrode tubes becomes easy. Further, in this case, the absorbent 23 is molded therefore, the glass wool material 24 is not necessary.

In some cases, depending on the concentration of NO$_x$ and HNO$_3$ which is diffused from a side of the discharge space 205 to a header 21 at a material gas side and a gas temperature and gas pressure in the ozone generating apparatus 2, after NO$_x$ and HNO$_3$ reaches the header 21 at a material gas side, NO$_x$ and HNO$_3$ is not rapidly diffused in a bottom of the header 21 at a material gas side. Therefore, in a case of Embodiment 1 of this invention, there is a little possibility such that before NO$_x$ and HNO$_3$ reaches a bottom of the header at a material gas side 21, NO$_x$ and HNO$_3$ enters inside of some of the high voltage electrode tubes 204. However, in Embodiment 2 of this invention, the absorbent 23 is provided at all of the high voltage electrode tubes 204, therefore, regarding above-mentioned, there is not any possibility at all.

Further, as a matter of course, the configuration of Embodiment 2 may be used by combining with that of Embodiment 1. In comparison with a case in which Embodiment 1 or Embodiment 2 is used alone, an amount of adsorbent to be used is increased, however, NO$_x$ and HNO$_3$ which is diffused can be reliably absorbed and removed.

As above mentioned, according to an ozone generating system in Embodiment 2, in an ozone generating operation standby period in an intermittent operation, the adsorbent 23 which is provided inside of the high voltage electrode tube 204 absorbs NO$_x$ and HNO$_3$ which is diffused in the ozone generating apparatus 2 from gas which is sealed in the ozone generating apparatus 2, NO$_x$ and HNO$_3$ will not enter from the contact part 207b to inside of the high voltage electrode tube 204 at a gas exit side. Consequently, the high voltage electrode 203 will not be corroded and degraded, and as a result, highly reliable intermittent operation system can be provided. Further, by setting gas pressure in the ozone generating apparatus 2 in an ozone generating operation standby period to be higher than operation gas pressure at least, diffusion flow velocity of NO$_x$ and HNO$_3$ can be decreased. Consequently, the probability of existence of NO$_x$ and HNO$_3$ in the header 21 at a material gas side can be decreased.

Embodiment 3

Figure 6:
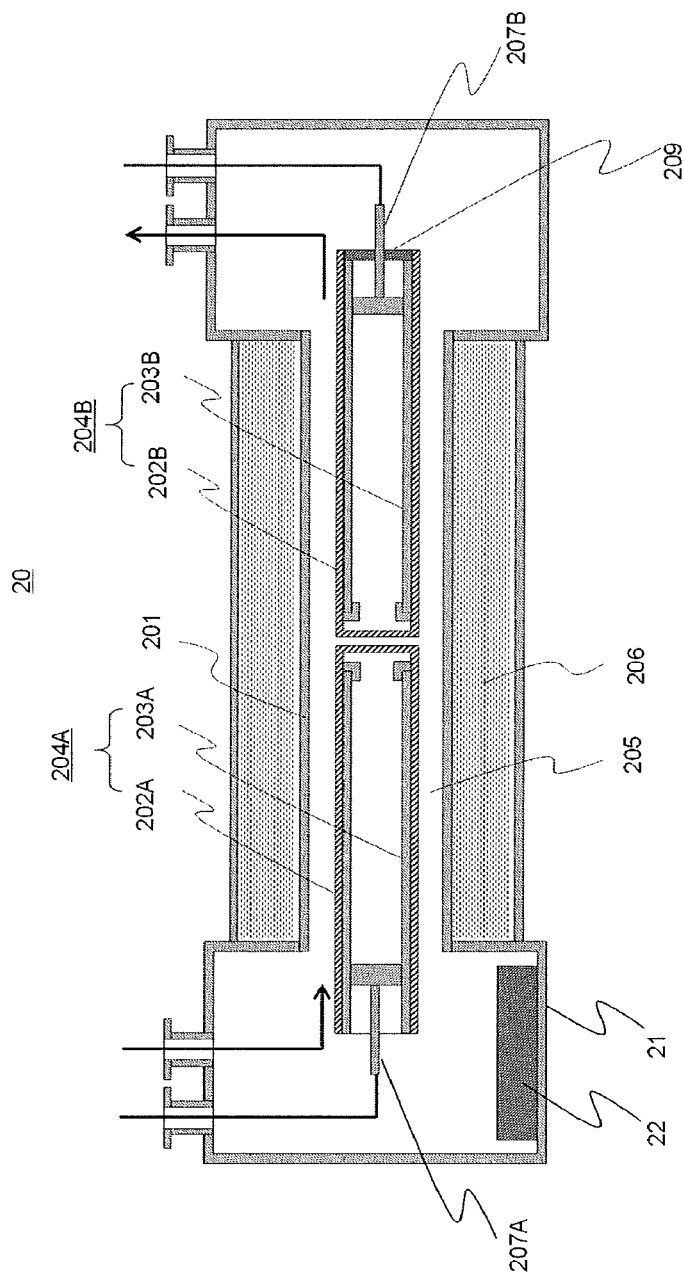
FIG. 6 is a cross-sectional view showing the configuration of an ozone generating apparatus in an ozone generating system according to Embodiment 3 of this invention.

An ozone generating system according to Embodiment 3 of this invention will be described. A basic configuration and operation of an ozone generating system according to Embodiment 3 is same as that of an ozone generating system according to Embodiments 1 and 2, however, there is a different point such that in Embodiment 3 two high voltage electrode tubes are provided in serial with respect to one ground electrode tube so as for closed end parts of the high voltage electrode tubes to face each other. FIG. 6 is a cross-sectional view showing the overall configuration of an ozone generating apparatus according to Embodiment 3 of this invention, and is a section view in a cut section which is parallel to gas flow direction in a discharge electrode part. For simplification, in FIG. 6, only one set of discharge electrode part is depicted, however, in actual, a plurality of discharge electrode parts are provided in parallel and connected. In FIG. 6, a part which is same as or corresponding to the configuration of FIGS. 2 to 5 will be given same reference character, and description will be omitted unless it is particularly required.

By comparing with a case of Embodiments 1 and 2, only different points will be described in the following. An ozone generating apparatus 2 shown in FIG. 6 is referred as a tandem type ozone generating apparatus. A basic configuration is same as that of an ozone generating apparatus which is described in Embodiments 1 and 2. A tandem type ozone generating apparatus is mainly applied to an ozone generating apparatus having large volume, and in comparison with a case in which one high voltage electrode tube is provided in one ground electrode tube 201, manufacturing cost of a high pressure tank and a ground electrode tube, etc. per unit ozone generation amount is reduced. Consequently, there is a merit such that an ozone generating apparatus can be produced at a lower price.

A high voltage electrode tube 204A at a gas entrance side and a high voltage electrode tube 204B at a gas exit side are provided in one ground electrode tube 201, and both of the high voltage electrode tubes are arranged so as to face their closed ends each other. Consequently, an AC high voltage which is necessary for ozone generation is applied from power feed members 207A and 207B individually which are provided at each of the high voltage electrode tubes. The high voltage electrode tube 204A is same as the high voltage electrode tube which is described in Embodiments 1 and 2. In the above-mentioned configuration, an open end of the high voltage electrode tube 204B exists at a side of an output gas which is produced in the ozone generating apparatus 2. Therefore, O$_3$ and NO$_x$ enters into the high voltage electrode tube 204B. Consequently, at an open end of the high voltage electrode tube 204B, a gas sealing plug 209 to suppress entering of O$_3$, NO$_x$, and HNO$_3$ into the inside of the high voltage electrode tube 204B is provided. Further, a high voltage electrode 203B in the high voltage electrode tube 204B may be formed of metal whose corrosion resistance is higher than that of a high voltage electrode 203A or metal which is easily passivated, and in this case, due to the resistance of metal itself, corrosion based on O$_3$, NO$_x$ or HNO$_3$ can be prevented, therefore, the gas sealing plug 209 is not absolutely necessary. In FIG. 6, in the same way as that of Embodiment 1, an absorbent 22 is provided in a bottom of a header 21 at a material gas side. The absorbent 22 is a dry type material which can absorb at least one of NO$_x$ and HNO$_3$.

In Embodiment 3, when the ozone generating apparatus 2 in an ozone generating operation period receives an operation standby command (ozone generation stop) from an ozone-utilizing facility 4 or receives a signal which indicates such that an operation time reaches a predetermined operation time which is determined by a control unit 8, ozone generation is stopped, after that, supplying of cooling water is stopped. Further, in order to exhaust O$_3$, NO$_x$ and HNO$_3$ which is produced gas from the ozone generating apparatus 2, gas in the ozone generating apparatus 2 is replaced by using a material gas for a predetermined time or until a value which is indicated by an ozone concentration meter in the ozone generating apparatus 2 becomes zero. At the point when it is judged such that gas in the ozone generating apparatus 2 is adequately replaced, gas pressure and a temperature in the ozone generating apparatus 2 is substantially uniform, valves V1 and V2 are closed so as to maintain pressure in the ozone generating apparatus 2 to be higher than operation gas pressure P at least and less than set pressure of a safety valve 7, supplying of a material gas is stopped, and a period is shifted to an ozone generating operation standby period.

In an ozone generating operation standby period, $NO_x$ and $HNO_3$, which is absorbed on a surface of an electrode tube in a discharge space in an ozone generating operation period, begins to be desorbed gradually due to change of an ambient temperature of the ozone generating apparatus 2 etc. $NO_x$ and $HNO_3$ which is desorbed is diffused to space where $NO_x$ and $HNO_3$ does not exist due to the concentration diffusion. $NO_x$ and $HNO_3$ which is diffused from the discharge space to the header 21 at a material gas side is heavier than oxygen or air, therefore, mostly, $NO_x$ and $HNO_3$ begins to be accumulated in a bottom of the header 21. $NO_x$ and $HNO_3$ which is diffused is contacted with an absorbent 22 which is provided in a bottom of the header 21, and is absorbed and removed from the ozone generating apparatus 2. Consequently, entering of $NO_x$ and $HNO_3$ which is diffused from an open end of the high voltage electrode tube 204A can be greatly suppressed, as a result, the high voltage electrode tube 203A will not be corroded and degraded due to contact with $NO_x$ and $HNO_3$. On the other hand, at an open end of the high voltage electrode tube 204B, an absorbent is not provided. This is because such that in the high voltage electrode tube 204B, the gas sealing plug 209 is provided, therefore $NO_x$ and $HNO_3$ which is diffused will not enter inside of the high voltage electrode tube 204B, therefore, the high voltage electrode tube 203B will not be corroded and degraded.

Further, regarding an absorbent which is provided in the ozone generating apparatus 2, the absorbent may be provided not only in a bottom of the header 21 at a material gas side but also at an open end of the high voltage electrode tube 204A in the same way as that of Embodiment 2. There is a little possibility such that before $NO_x$ and $HNO_3$ reaches a bottom of the header 21 at a material gas side, $NO_x$ and $HNO_3$ enters inside of some of the high voltage electrode tubes 204. However, when an absorbent 23 is provided at all of the high voltage electrode tubes 204A, regarding above-mentioned, there is not any possibility at all. As a matter of course, an absorbent may be provided at both of a bottom of the header 21 at a material gas side and an open end of the high voltage electrode tube 204A. In comparison with a case in which an absorbent is provided either in a bottom of the header 21 at a material gas side or at an open end of the high voltage electrode tube 204A, an amount of adsorbent to be used is increased, however, $NO_x$ and $HNO_3$ which is diffused can be reliably absorbed and removed.

In an ozone generating operation standby period, diffusion of $NO_x$ and $HNO_3$ which is desorbed in the ozone generating apparatus 2 to inside of the ozone generating apparatus 2 also depends on sealing gas pressure in the ozone generating apparatus 2. In the ozone generating apparatus 2, an amount of $NO_x$ and $HNO_3$ which moves on a unit area in a unit time, that is, diffusion flow velocity becomes smaller when gas pressure in the ozone generating apparatus 2 is higher. In Embodiment 3 of this invention, when a period is shifted from an ozone generating operation period to an ozone generating operation standby period, gas pressure in the ozone generating apparatus 2 is increased to be higher than operation gas pressure P, therefore diffusion flow velocity of $NO_x$ and $HNO_3$ in an ozone generating operation standby period can be decreased. That is, in an ozone generating operation standby period, the probability of existence of $NO_x$ and $HNO_3$ in the header 21 at a material gas side can be decreased.

As above mentioned, according to an ozone generating system in Embodiment 3 of this invention, in an ozone generating operation standby period in an intermittent operation, the adsorbent 22 which is provided in the header 21 at a material gas side in the tandem type ozone generating apparatus 2 absorbs $NO_x$ and $HNO_3$ which is diffused in the tandem type ozone generating apparatus 2 from gas which is sealed in the ozone generating apparatus 2, therefore entering of $NO_x$ and $HNO_3$ into inside of the high voltage electrode tube 204 whose one part is open can be greatly suppressed. Consequently, the high voltage electrode 203 will not be corroded and degraded, and as a result, highly reliable intermittent operation system can be provided. Further, by setting gas pressure in the tandem type ozone generating apparatus 2 in an ozone generating operation standby period to be higher than operation gas pressure at least, diffusion flow velocity of $NO_x$ and $HNO_3$ can be decreased. Consequently, the probability of existence of $NO_x$ and $HNO_3$ in the header 21 at a material gas side can be decreased.

Embodiment 4

Figure 7:
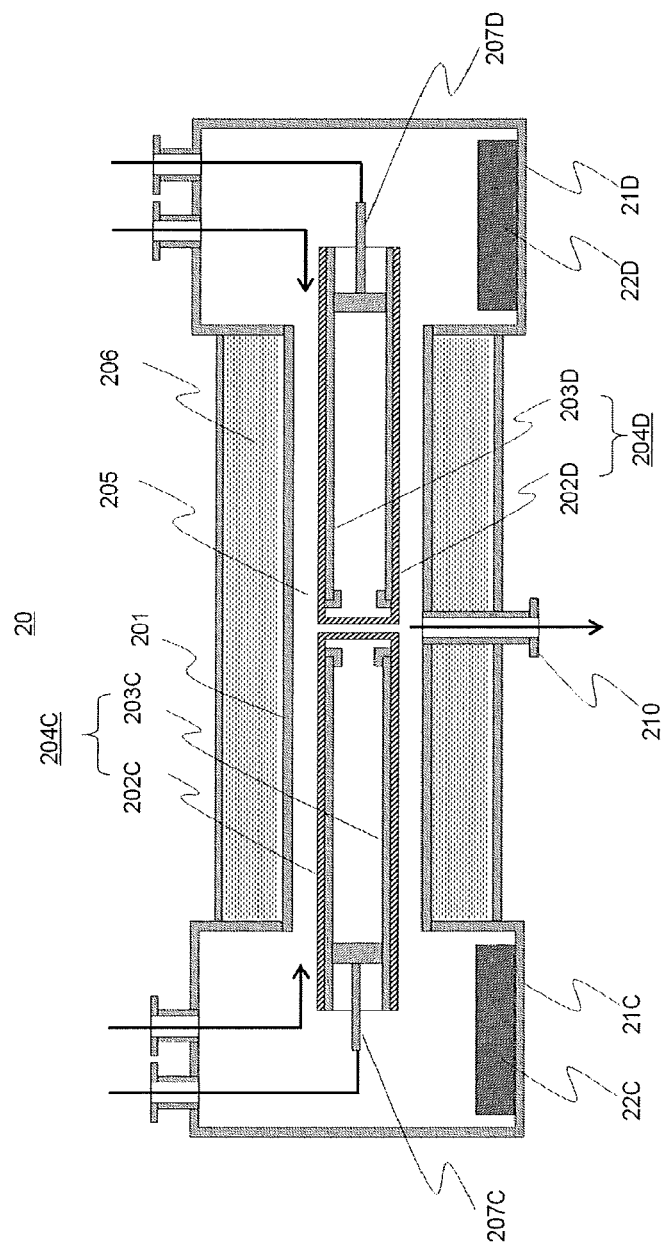
FIG. 7 is a cross-sectional view showing the configuration of an ozone generating apparatus in an ozone generating system according to Embodiment 4 of this invention.

An ozone generating system according to Embodiment 4 of this invention will be described. A basic configuration and operation of an ozone generating system according to Embodiment 4 is same as that of an ozone generating system according to Embodiments 1 to 3. Further, the configuration of an ozone generating apparatus is a tandem type configuration which is substantially same as that of Embodiment 3, however, a gas entrance and a gas exit of an ozone generating apparatus 2 are different. FIG. 7 is a cross-sectional view showing the overall configuration of an ozone generating apparatus according to Embodiment 4 of this invention, and is a section view in a cut section which is parallel to gas flow direction in a discharge electrode part. For simplification, in FIG. 7, only one set of discharge electrode part 20 is depicted, however, in actual, a plurality of discharge electrode parts are provided in parallel and connected. In FIG. 7, a part which is same as or corresponding to the configuration of FIGS. 2 to 6 will be given same reference character, and description will be omitted unless it is particularly required.

In FIG. 7, from both sides, that is, from left side and right side, a material gas is supplied. That is, headers 21C and 21D at a material gas side are provided at left side and right side of the ozone generating apparatus 2. A high voltage electrode tube 204C at left side and a high voltage electrode tube 204D at right side are provided in one ground electrode tube 201 so as for closed ends of the high voltage electrode tubes to face each other. Consequently, an AC high voltage which is necessary for ozone generation is applied from power feed members 207C and 207D which are provided at each of the high voltage electrode tubes. Further, a gas exit 210 is provided at a center part of the ozone generating apparatus 2, that is, a part where closed end parts of two high voltage electrode tubes 204C and 204D are facing each other. The high voltage electrode tubes 204C and 204D are same as the high voltage electrode tube 204 which is described in Embodiments 1 and 2. In the above-mentioned configuration, closed end parts of the high voltage electrode tubed 204C and 204D exist at a side of output gas which is produced in the ozone generating apparatus 2. Further, absorbents 22C and 22D are provided in a bottom of the headers 21C and 21D at a material gas side. The absorbents 22C and 22D are dry type material which can absorb at least one of $NO_x$ and $HNO_3$.

In Embodiment 4, when the ozone generating apparatus 2 in an ozone generating operation period receives an operation standby command (ozone generation stop) from an ozone-utilizing facility 4 or receives a signal which indicates such that an operation time reaches a predetermined operation time which is determined by a control unit 8, ozone generation is stopped, after that, supplying of cooling water is stopped. Further, in order to exhaust $O_3$, $NO_x$ and $HNO_3$ which is produced gas from the ozone generating apparatus 2, gas in the ozone generating apparatus 2 is replaced by using a material gas for a predetermined time or until a value which is indicated by an ozone concentration meter in the ozone generating apparatus 2 becomes zero. At the point when it is judged such that gas in the ozone generating apparatus 2 is adequately replaced, gas pressure and a temperature in the ozone generating apparatus 2 is substantially uniform, valves V1 and V2 are closed so as to maintain the pressure in the ozone generating apparatus 2 to be higher than operation gas pressure P at least and less than set pressure of a safety valve 7, supplying of a material gas is stopped, and a period is shifted to an ozone generating operation standby period.

In an ozone generating operation standby period, $NO_x$ and $HNO_3$, which is absorbed on a surface of an electrode tube in a discharge space in an ozone generating operation period, begins to be desorbed gradually due to change of an ambient temperature of the ozone generating apparatus 2 etc. $NO_x$ and $HNO_3$ which is desorbed is diffused to space where $NO_x$ and $HNO_3$ does not exist due to the concentration diffusion. $NO_x$ and $HNO_3$ which is diffused from the discharge space to the headers 21C and 21D at a material gas side is heavier than oxygen or air, therefore, mostly, $NO_x$ and $HNO_3$ begins to be accumulated in bottoms of the headers 21C and 21D at a material gas. NOx and $HNO_3$ which is diffused is contacted with the absorbents 22C and 22D which are provided in bottoms of the headers 21C and 21D, and is absorbed and removed from the ozone generating apparatus 2. Consequently, entering of $NO_x$ and $HNO_3$ which is diffused from an open end of the high voltage electrode tubes 204C and 204D can be greatly suppressed, as a result, high voltage electrode tubes 203C and 203D will not be corroded and degraded due to contact with $NO_x$ and $HNO_3$.

Further, regarding an absorbent which is provided in the ozone generating apparatus 2, the absorbent may be provided not only in a bottom of the headers 21C and 21D at a material gas side but also at an open end of each of the high voltage electrode tubes 204C and 204D in the same way as that of Embodiment 2. There is a little possibility such that before $NO_x$ and $HNO_3$ reaches a bottom of the headers 21C and 21D at a material gas side, $NO_x$ and $HNO_3$ enters inside of some of the high voltage electrode tubes 204C and 204D. However, when an absorbent is provided at all of the high voltage electrode tubes 204C and 204D, regarding the above-mentioned, there is not any possibility at all. As a matter of course, an absorbent may be provided at both of bottoms of the headers 21C and 21D at a material gas side and an open end part of each of the high voltage electrode tubes 204C and 204D. In comparison with a case in which an absorbent is provided either at a bottom of the headers 21C and 21D at a material gas side or at an open end part of each of the high voltage electrode tubes 204C and 204D, an amount of adsorbent to be used is increased, however, $NO_x$ and $HNO_3$ which is diffused can be reliably absorbed and removed.

In an ozone generating operation standby period, diffusion of $NO_x$ and $HNO_3$ which is desorbed in the ozone generating apparatus 2 to inside of the ozone generating apparatus 2 also depends on sealing gas pressure in the ozone generating apparatus 2. In the ozone generating apparatus 2, an amount of $NO_x$ and $HNO_3$ which moves on a unit area in a unit time, that is, diffusion flow velocity becomes smaller when gas pressure in the ozone generating apparatus 2 is higher. In Embodiment 4 of this invention, when a period is shifted from an ozone generating operation period to an ozone generating operation standby period, gas pressure in the ozone generating apparatus 2 is increased to be higher than operation gas pressure P, therefore diffusion flow velocity of $NO_x$ and $HNO_3$ in an ozone generating operation standby period can be decreased. That is, in an ozone generating operation standby period, the probability of existence of $NO_x$ and $HNO_3$ in the headers 21C and 21D at a material gas side can be decreased.

As above mentioned, according to an ozone generating system in Embodiment 4 of this invention, in an ozone generating operation standby period in an intermittent operation, the adsorbents 22C and 22D which are provided at the headers 21C and 21D at a material gas side inside the tandem type ozone generating apparatus 2 absorb $NO_x$ and $HNO_3$ which is diffused in the tandem type ozone generating apparatus 2 from gas which is sealed in the ozone generating apparatus 2, therefore entering of $NO_x$ and $HNO_3$ to inside of the high voltage electrode tubes 204C and 204D whose one part is open can be greatly suppressed. Consequently, high voltage electrodes 203C and 203D will not be corroded and degraded, and as a result, a highly reliable intermittent operation system can be provided. Further, by setting gas pressure in the tandem type ozone generating apparatus 2 in an ozone generating operation standby period to be higher than operation gas pressure at least, diffusion flow velocity of $NO_x$ and $HNO_3$ can be decreased. Consequently, the probability of existence of $NO_x$ and $HNO_3$ in the headers 21C and 21D at a material gas side can be decreased.

Embodiment 5

Figure 8:
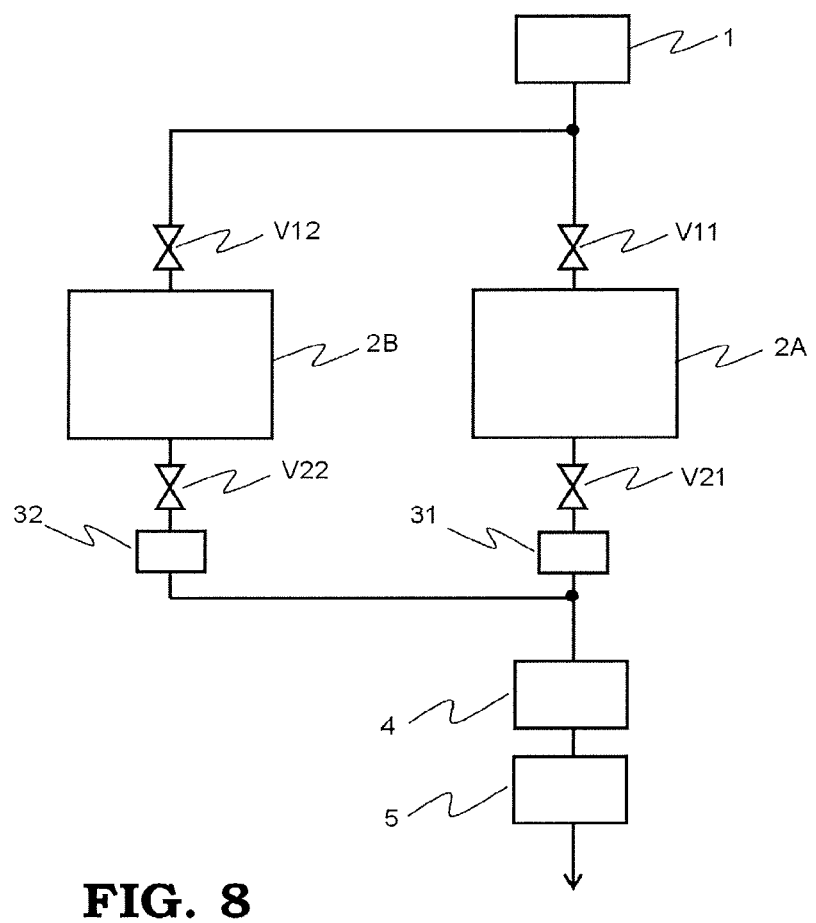
FIG. 8 is a block diagram for showing the configuration of an ozone generating system and a gas flow line according to Embodiment 5 of this invention.

An ozone generating system according to Embodiment 5 of this invention will be described. A basic configuration and operation of an ozone generating system according to Embodiment 5 is same as that of at least one of ozone generating systems according to Embodiments 1 to 4, however, there is a different point such that in a range which does not deviate from a concept of an intermittent operation, a little of material gas is utilized for an ozone generating apparatus in an ozone generating operation standby period. FIG. 8 is a block diagram for showing the configuration of an ozone generating system and a flow line according to Embodiment 5 of this invention. FIG. 8 is applied to a case in which two ozone generating apparatuses are operated and stopped alternately, or a case in which one of two ozone generating apparatuses is for back up, and when necessary ozone generation amount is not generated only by one other ozone generating apparatus, the ozone generating apparatus for back up is also operated. In FIG. 8, a part which is same as or corresponding to the configuration of FIG. 1 will be given same reference character, and description will be omitted unless it is particularly required.

By comparing with cases of Embodiments 1 to 4, only different points will be described in the following. In Embodiment 5, two ozone generating apparatuses 2A and 2B are operated and stopped repeatedly. In this case, both of the ozone generating apparatuses 2A and 2B are operated intermittently. Alternatively, the ozone generating apparatus 2A is operated continuously, only in a case where due to request from an ozone-utilizing facility 4, necessary ozone generation amount is not generated only by the ozone generating apparatus 2A, the ozone generating apparatus 2B is operated. In this case, only he ozone generating apparatus 2B is operated intermittently. Here, an example in which two ozone generating apparatuses are provided, and both of them are operated and stopped repeatedly will be described, however, the number of ozone generating apparatuses which constitutes the system is not limited to two, and a case in which more than three ozone generating apparatuses are used will be acceptable.

In a case where the ozone generating apparatus 2A is in an ozone generating operation period, valves V11 and V21 are opened, regarding the ozone generating apparatus 2B in an ozone generating operation standby period, in a stopping step just before a period is shifted to an ozone generating operation standby period, adequate gas replacement is performed by using a material gas, gas is sealed in the apparatus with pressure which is higher than operation gas pressure P at least. Valves V12 and V22 are closed. Further, an absorbent which removes $NO_x$ and $HNO_3$ which is diffused in an ozone generating apparatus in an ozone generating operation standby period is same as that described in Embodiments 1 to 4, and is provided at least one of a header at a material gas side and an open end of a high voltage electrode tube of each of the two ozone generating apparatuses 2A and 2B.

In the ozone generating apparatus 2B in an ozone generating operation standby period, after an ozone generating operation standby period starts, at least once in one to two days, the valves V12 and V22 are opened, with respect to a flow rate of a material gas which is supplied to the ozone generating apparatus 2A in an ozone generation operation period, extremely small flow rate of a material gas is supplied to the ozone generating apparatus 2B as purge gas. At a rear stage of the ozone generating apparatuses 2A and 2B, check valves 31 and 32 are provided, therefore, gas which is exhausted from both of the ozone generating apparatuses 2A and 2B will not be flowed backward individually. By performing the above-mentioned operation, before $NO_x$ and $HNO_3$ which begins to be diffused in the ozone generating apparatus 2B reaches a header at a material gas side, $NO_x$ and $HNO_3$ will be exhausted outside of the ozone generating apparatus 2B together with a material gas and is accompanied with output gas of the ozone generating apparatus 2A. The above-mentioned operation period is referred to as a purge period. Even if some of $NO_x$ and $HNO_3$ reaches a header at a material gas side of the ozone generating apparatus 2B, gas is flowed in the ozone generating apparatus 2B by purge gas so as to generate agitation. Consequently, $NO_x$ and $HNO_3$ is contacted with an absorbent which is provided in the ozone generating apparatus 2B, and is absorbed and removed.

The ozone generating apparatus 2B is controlled to have at least one purge period during an ozone generating operation standby period which is designated by user. The number of a purge period is determined based on a length of an ozone generating operation standby period. When a purge period is completed, gas is sealed so as for gas pressure in the ozone generating apparatus 2B to be higher than operation gas pressure P, and the valves V12 and V22 are closed. When an ozone generating operation standby period which is designated by user is completed, the valves V12 and V22 are opened, a stopping process of the ozone generating apparatus 2A is completed, gas is sealed so as for gas pressure in the ozone generating apparatus 2A to be higher than operation gas pressure P, the valves V11 and V21 are closed, a period of the ozone generating apparatus 2B is shifted to be an ozone generating operation period, and a period of the ozone generating apparatus 2A is shifted to be an ozone generating operation standby period.

In an ozone generating apparatus which is described in Embodiment 5, a case in which an amount of $NO_x$ and $HNO_3$ is produced most when an ozone is generated is a case in which air is a material gas. In this case, it takes at least more than two or three days for $NO_x$ and $HNO_3$ which is diffused in an ozone generating apparatus to be completely diffused to a header at a material gas side. Further, in an ozone generating apparatus in an ozone generating operation standby period, a diffusion flow rate which is generated by the concentration diffusion of $NO_x$ and $HNO_3$ with respect to one discharge space is $1 \times 10^{-6}$ L/min(N) or less (N indicates 0 degrees centigrade, 1 atm), that is, very small amount. For example, in a case where 1000 pieces of electrode tubes are provided in an ozone generating apparatus, total diffusion flow amount is $1 \times 10^{-3}$ L/min(N) or less, that is, extremely small. In order to prevent $NO_x$ and $HNO_3$ which is diffused from reaching a header at a material gas side, it is necessary for an amount of a material gas which is larger than a diffusion flow amount to be supplied. In a case of 1000 electrode tubes, it is necessary to supply $1 \times 10^{-3}$ L/min (N) or more of purge gas. The above-mentioned is 0.00001% of total flow amount of a material gas which is supplied to an ozone generating apparatus. That is, a flow rate of purge gas in a purge period may be less than one millionth of a gas flow rate in an ozone generating operation period and more than one ten millionth of a gas flow rate in an ozone generating operation period. Further, regarding one purge period, a length of time may be at least for purge gas to completely pass through a discharge space from a header at a material gas. Therefore in a case of ozone generating apparatuses which are described in Embodiments 1 to 2, a satisfactory length of time may be 1 to 1.5 hours, and in a case of tandem type ozone generating apparatuses which are described in Embodiments 3 to 4, a length satisfactory of time may be 2 to 3.5 hours. Further, it is not necessary for purge gas to be same gas as that of a material gas, and for example, in a case where a material gas is oxygen gas, dry air may be supplied as purge gas.

As above mentioned, in comparison with an amount of a material gas which is used for ozone generation, by using an extremely small amount of gas as purge gas for an ozone generating apparatus in an ozone generating operation standby period, the probability of existence of $NO_x$ and $HNO_3$ which is diffused in a header at a material gas side can be adequately decreased. Further, purge gas is exhausted from an ozone generating apparatus in an ozone generating operation standby period and is mixed with ozonized gas which is produced by an ozone generating apparatus in an ozone generating operation period, however, purge gas flow rate is extremely small, therefore, the concentration of ozonized gas is not affected. Further, purge gas is supplied from a gas supplying device 1 in operation, therefore, cost which is added up in an ozone generating operation standby period will not be increased. Further, an exhausting facility which is dedicated to exhausting of purge gas of an ozone generating apparatus in an ozone generating operation standby period is not necessary. Consequently, a slight amount of gas is used for an ozone generating apparatus in an ozone generating operation standby period, however, concept of intermittent operation in which saving energy is considered will not be lost.

As above mentioned, according to an ozone generating system in Embodiment 5 which is constituted by a plurality of ozone generating apparatuses at which an absorbent is provided individually, some of a material gas is supplied as purge gas to an ozone generating apparatus in an ozone generating operation standby period, therefore, the probability of existence of $NO_x$ and $HNO_3$ in a header at a material gas side in an ozone generating apparatus in an ozone generating operation standby period can be decreased. Consequently, a high voltage electrode 203 in an ozone generating apparatus in an ozone generating operation standby period will not be corroded and degraded, and as a result, a highly reliable intermittent operation system can be provided.

Further, in Embodiment 5, in an ozone generating system which is constituted by a plurality of ozone generating apparatuses, an ozone generating apparatus in an ozone generation operation standby period which has a purge period was described. Further, it is needless to say such that in an ozone generating system which is constituted by a plurality of ozone generating apparatuses, an ozone generating apparatus in an ozone generating operation standby period which does not have a purge period as described in Embodiments 1 to 4 is acceptable. Further, in an ozone generating system which is constituted by one ozone generating apparatus which is described in Embodiments 1 to 4, a purge period may be provided in an ozone generating operation standby period.

Embodiment 6

Figure 9:
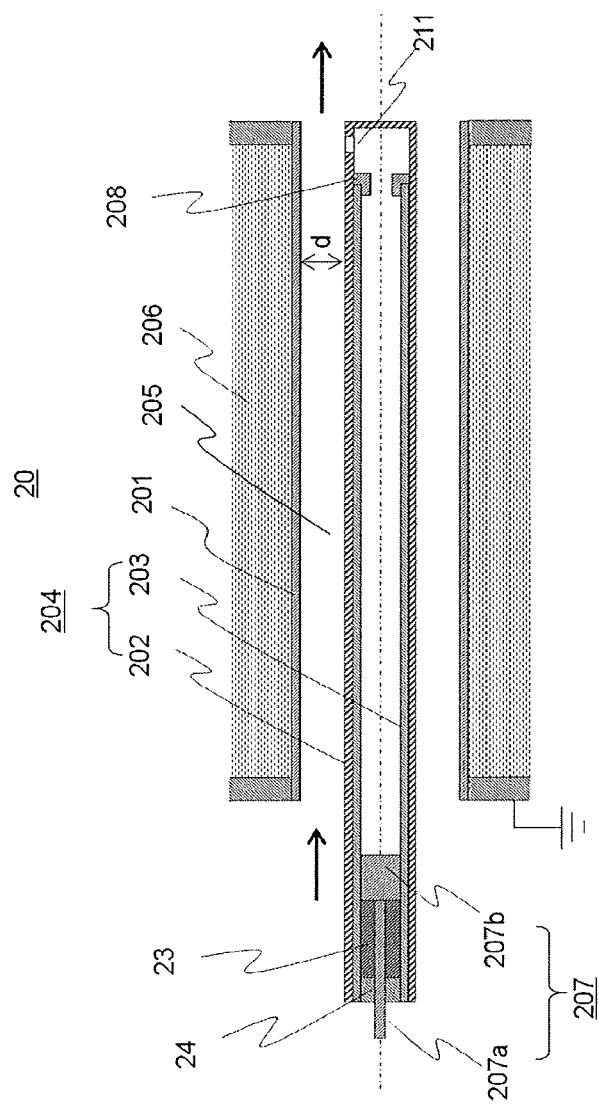
FIG. 9 is a cross-sectional view showing the configuration of an ozone generating apparatus in an ozone generating system according to Embodiment 6 of this invention.

An ozone generating system according to Embodiment 6 of this invention will be described. Regarding a basic configuration and operation, an ozone generating system according to Embodiment 6 is constituted by a plurality of ozone generating apparatuses at which an absorbent is provided in the same way as that in Embodiment 5, and at least one of ozone generating apparatuses is operated intermittently. However, the configuration of a high voltage electrode which is provided in an ozone generating apparatus is slightly different from that which was described in Embodiments 1 to 5. FIG. 9 is a cross-sectional view showing the configuration of a discharge electrode part 20 in an ozone generating apparatus according to Embodiment 6, and is a section view in a cut section which is parallel to gas flow direction in a discharge electrode part. In FIG. 9, a part which is same as or corresponding to the configuration of FIGS. 1 and 4 will be given same reference character, and description will be omitted unless it is particularly required.

In a discharge electrode part in an ozone generating apparatus shown in FIG. 9, an absorbent 23 is provided at an open end part of a high voltage electrode tube 204 in the same way as that in Embodiment 2. Further, in a wall surface at a side which is opposite to a side to which a material gas of a dielectric tube 202 is supplied, a micro through hole 211 having a diameter which is 0.5 mm or less is formed. For example, in the same way as that of Embodiment 5, a case in which an ozone generating apparatus 2A is in an ozone generating operation period, and an ozone generating apparatus 2B is in an ozone generating operation standby period will be described as an example. In a case where the dielectric tube 202 is provided in the ozone generating apparatus 2B in an ozone generation operation standby period, in a purge period, purge gas is distributed not only in a discharge space 205 but also in the absorbent 23 and inside of the dielectric tube 202 via the micro through hole 211. Therefore, $NO_x$ and $HNO_3$ which is diffused in the ozone generating apparatus 2B is exhausted outside of the ozone generating apparatus 2B by purge gas, and in addition to that, is distributed inside the absorbent 23, absorbed and removed. A flow velocity of purge gas is extremely small, therefore in the absorbent 23, an extremely high absorption efficiency having a small SV value (Space Velocity) can be realized. As a matter of course, when an absorbent is provided also at a header at a material gas side in the ozone generating apparatus 2B, $NO_x$ and $HNO_3$ can be absorbed and removed furthermore.

Further, when a period of the ozone generating apparatus 2B is shifted to an ozone generating operation period, a slight amount of a material gas is passed not through the discharge space 205 but inside of the dielectric tube 202 via the micro through hole 211. A material gas which is passed through the dielectric tube 202 is not contributed to generation of ozone, therefore an ozone generation efficiency will be decreased, however, heat which is generated from the dielectric tube 202 and a high voltage electrode 203 when discharge is generated can be removed by a flow of gas, consequently, an ozone generation efficiency can be improved. As a result, even when the micro through hole 211 exists in the dielectric tube 202, an ozone generation efficiency of the ozone generating apparatus 2B will not be greatly decreased.

As above mentioned, in an ozone generating system which is constituted of a plurality of ozone generating apparatuses, the configuration in which the micro through hole 211 having a diameter which is 0.5 mm or less is formed in a wall surface at a side which is opposite to a side to which a material gas of a dielectric tube 202 is supplied was described. However, in an ozone generating system which is constituted by one ozone generating apparatus, it is needless to say such that the configuration in which the micro through hole 211 having a diameter which is 0.5 mm or less is formed in a wall surface at a side which is opposite to a side to which a material gas of a dielectric tube 202 is supplied is acceptable.

As above mentioned, according to an ozone generating system which is constituted by a plurality ozone generating apparatuses at which an absorbent is provided in Embodiment 6, some of a material gas is supplied to an ozone generating apparatus in an ozone generating operation standby period as purge gas, consequently, the probability of existence of $NO_x$ and $HNO_3$ in a header at a material gas side can be decreased. Further, via the micro through hole 211 which is provided in the dielectric tube 202, purge gas is also distributed inside of the dielectric tube 202, consequently, an absorption efficiency of $NO_x$ and $HNO_3$ in the absorbent 23 which is provided at an open end part of the high voltage electrode tube 204 can be improved. As above mentioned, the high voltage electrode tube 203 of an ozone generating apparatus in an ozone generating operation standby period will not be corroded and degraded, therefore, a highly reliable intermittent operation system can be provided. Further, in an ozone generating apparatus in an operation period, via the micro through hole 211, a material gas is flowed inside the dielectric tube 202, therefore generating heat in an electrode part is removed, and as a result, decreasing of an ozone generation efficiency can be suppressed.

Embodiment 7

Figure 10:
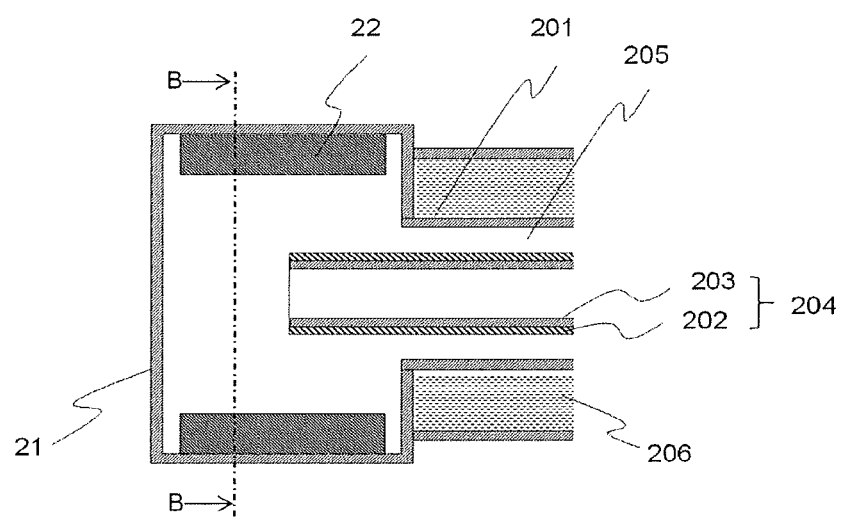
FIG. 10 is a cross-sectional view showing the configuration of a principal part of an ozone generating apparatus in an ozone generating system according to Embodiment 7 of this invention.
Figure 11:
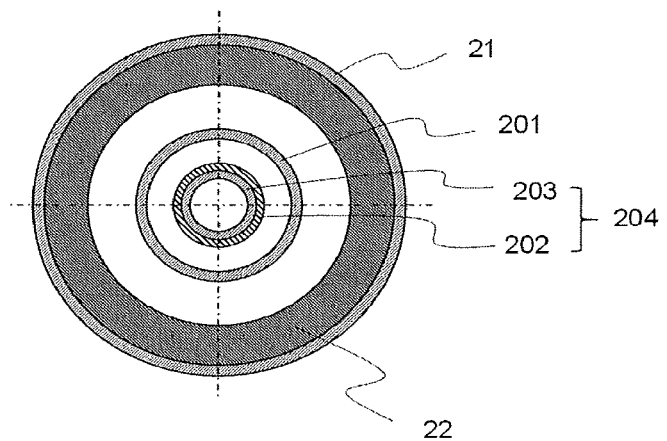
FIG. 11 is a cross-sectional view showing one example of the configuration of a principal part of an ozone generating apparatus in an ozone generating system according to Embodiment 7 of this invention, taken on line B-B in FIG. 10.

An ozone generating system according to Embodiment 7 of this invention will be described. A basic configuration and operation of an ozone generating system according to Embodiment 7 is same as that of Embodiment 1, and is describing one example regarding installation of an absorbent. FIG. 10 is a cross-sectional view of a cut section of a header 21 at a material gas side of an ozone generating apparatus 2 in a cut section which is parallel to a direction of a gas flow, and FIG. 11 is a cross-sectional view taken on line B-B in FIG. 10. For simplification of Figure, in FIGS. 10 and 11, only one set of discharge electrode part is depicted, however, in actual, a plurality of discharge electrode parts according to necessary generation amount are provided in parallel and connected. Further, description of a joint part with exterior part and a power feed member are omitted. In FIGS. 10 and 11, a part which is same as or corresponding to the configuration of FIGS. 2 and 3 will be given same reference character, and description will be omitted unless it is particularly required.

As an absorbent 22 in Embodiment 7, zeolite having a pellet-shaped and which is a dry type material which can absorb at least one of $NO_x$ and $HNO_3$ (nitric acid) is used. It is needless to say such that a dry type material which can absorb both of $NO_x$ and $HNO_3$ is more preferable. Further, as the absorbent 22, in addition to zeolite, alumina and an alkali neutralizer including calcium hydroxide and sodium hydroxide or mixture thereof may be used and a chemical adsorbent type is preferable, however, in an ozone generation operation standby period, energy which is necessary for desorbing $NO_x$ and $HNO_3$ from a surface of an electrode tube (temperature change, etc.) is not drastically applied to the ozone generating apparatus 2, therefore, a physical adsorbent type is acceptable.

Further, the configuration of the absorbent 22 is either of granular, pellet-shaped, powdery or molded body such as honeycomb, and it is preferable to fix the absorbent in the ozone generating apparatus 2 using a fixing tool. In the above-mentioned, in a case where the absorbent is granular, pellet-shaped or powdery, it is preferable to cover the absorbent with nonwoven fabric or a porous material and in a case where the absorbent is molded body, it is not necessary for the absorbent to be covered.

Figure 12:
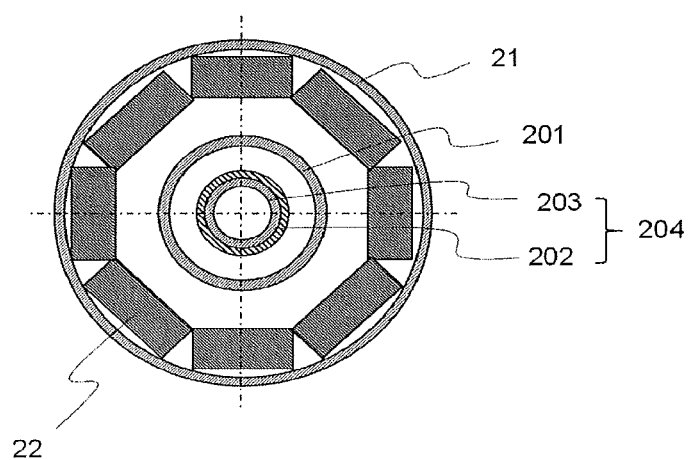
FIG. 12 is a cross-sectional view showing another example of the configuration of a principal part of an ozone generating apparatus in an ozone generating system according to Embodiment 7 of this invention, taken on line B-B in FIG. 10.

The absorbent 22 in Embodiment 7 is arranged along the inner periphery of the header 21 at a material gas side. In the ozone generating apparatus 2, the absorbent 22 is arranged so as to utilize effectively space in the header 21 at a material gas side where a gas flow velocity is smallest and to enhance the probability of contacting the absorbent and $NO_x$ and $HNO_3$ which is diffused. Especially, in a case where the absorbent is molded body, in addition to FIG. 11, as shown in a cross sectional view of FIG. 12, it is also acceptable to split the absorbent 22 into a plurality of molded bodies to be arranged.

As above mentioned, according to an ozone generating system in Embodiment 7, in an ozone generating operation standby period in an intermittent operation, the absorbent 22 which is provided in the header 21 at a material gas side absorbs $NO_x$ and $HNO_3$ which is diffused in the ozone generating apparatus 2 from gas which is sealed in the ozone generating apparatus 2, therefore $NO_x$ and $HNO_3$ which enters inside a high voltage electrode tube 204 having one open end can be greatly suppressed. Consequently, a high voltage electrodes 203 will not be corroded and degraded, and as a result, a highly reliable intermittent operation system can be provided. Further, the absorbent 22 is arranged in the header 21 at a material gas side so as to enhance the probability of contacting the absorbent 22 and $NO_x$ and $HNO_3$, therefore entering of $NO_x$ and $HNO_3$ inside the high voltage electrode tube 204 can be certainly suppressed.

Embodiment 8

Figure 13:
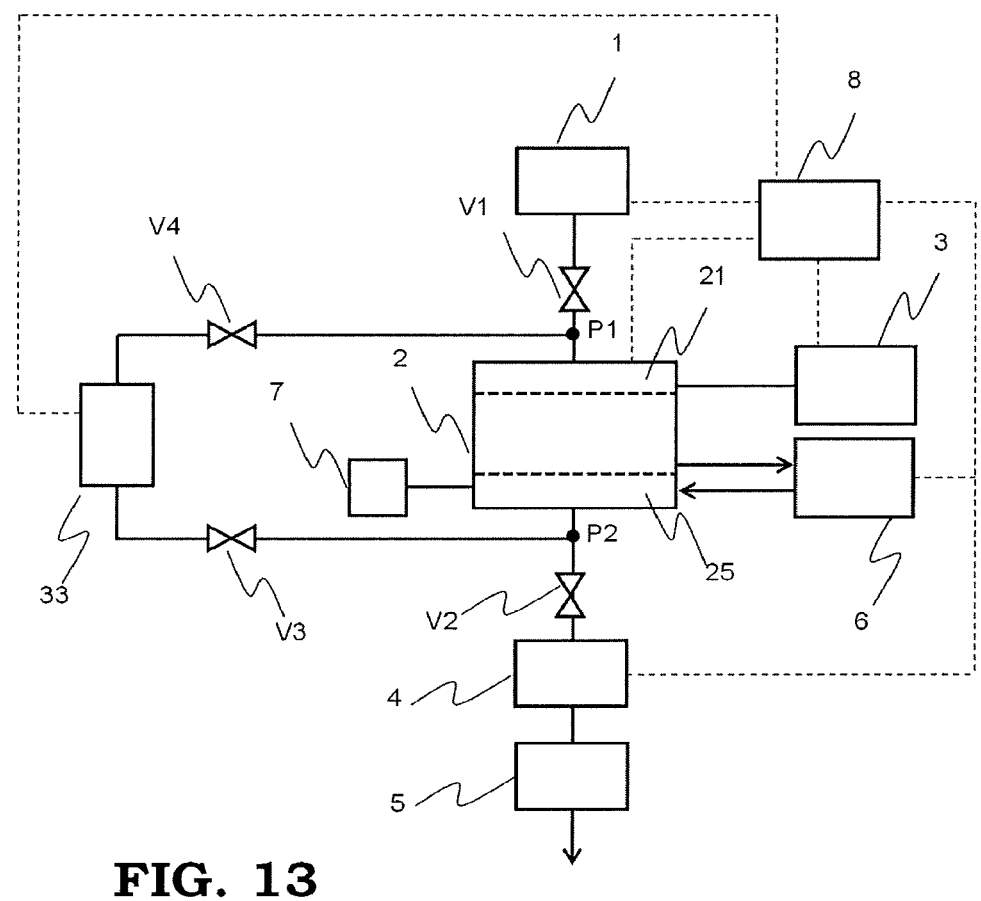
FIG. 13 is a block diagram for showing the configuration of an ozone generating apparatus in an ozone generating system and a gas flow line according to Embodiment 8 of this invention.

An ozone generating system according to Embodiment 8 of this invention will be described. FIG. 13 is a block diagram for showing the configuration of an ozone generating apparatus and a flow line according to Embodiment 8 of this invention. In FIG. 13, a part which is same as or corresponding to the configuration of FIG. 1 will be given same reference character, and description will be omitted unless it is particularly required. A basic configuration and operation of an ozone generating system according to Embodiment 8 is same as that of Embodiment 1, there is a different point such that a gas circulating unit is provided outside of an ozone generating apparatus.

By comparing with case of Embodiment 1, only different points will be described in the following. In Embodiment 8, in an ozone generating operation standby period of an intermittent operation, a material gas which is sealed in an ozone generating apparatus 2 is circulated to the direction from a port P2 at a gas exit side to a port P1 at a gas entrance side by using a circulating fan 33 which is provided outside the ozone generating apparatus 2. Operation of the circulating fan 33 is performed in an arbitrary time in an ozone generating operation standby period. Further, diffusion of $NO_x$ and $HNO_3$ in the ozone generating apparatus 2 is extremely gentle and is small amount, therefore, for example, a short-time operation such as several minutes or several hours in an ozone generating operation standby period is acceptable. By the operation of the circulating fan 33, in an ozone generating operation standby period, at least for the time being, a gas flow from a gas entrance side to a gas exit side is formed in the ozone generating apparatus 2, therefore, diffusion of $NO_x$ and $HNO_3$ to the header 21 at a material gas side can be delayed. Further, in the header 21 at a material gas side, an absorbent which is same as that which is described in Embodiment 1 is provided, and gas which is absorbed from a header 25 at an ozone side and is circulated to the header 21 at a material gas side can be positively contacted with the absorbent in the header 21 at a material gas side, $NO_x$ and $HNO_3$ can be removed from gas which is sealed in the ozone generating apparatus 2, as a result, gas can be cleaned.

A diameter of piping which connects the circulating fan 33 and the ozone generating apparatus 2 is sufficiently small in comparison with a section area of the header 21 at a material gas. Therefore, a flow velocity of the circulated gas is decreased at a stage where the gas is introduced to the header 21 at a material gas, consequently, the circulated gas can be adequately contacted with an absorbent which is provided at the same place.

In the following, concrete operation will be described. In an ozone generating operation period, valves V1 and V2 are opened, and valves V 3 and V4 are closed. An operation of the circulating fan 33 is also stopped. After a predetermined operation time is passed and a period is shifted to an ozone generating operation standby period, gas replacement (purge) in the ozone generating apparatus 2 is performed by a material gas for a predetermined time. After that, valves V1 and V2 are closed so as to make gas pressure in the ozone generating apparatus 2 higher than gas pressure in an ozone generating operation period, and a material gas is sealed. After that, by a command from a control unit 8, the circulating fan 33 starts to be operated, and valves V3 and V4 are opened. Accordingly, gas which is sealed in the ozone generating apparatus 2 starts to be circulated from the port P2 at a gas exit side to the port P1 at a gas entrance side, and a gas flow is generated in the ozone generating apparatus 2. $NO_x$ and $HNO_3$ in the ozone generating apparatus 2 is circulated by passing outside the ozone generating apparatus 2, and is positively contacted with an absorbent which is provided in the header 21 at a material gas side, for example, and is absorbed and cleaned. As a result, cleaning of gas in the ozone generating apparatus 2 is promoted.

As above mentioned, according to an ozone generating system in Embodiment 8, in an ozone generating operation standby period in an intermittent operation, gas which is sealed in the ozone generating apparatus 2 is circulated via the circulating fan 33 which is provided outside the ozone generating apparatus 2 from the header 25 at an ozone side to the header 21 at a material gas side, for example, gas is contacted with an absorbent which is provided in the header 21 at a material gas, consequently, $NO_x$ and $HNO_3$ can be absorbed and removed from the gas and the gas can be cleaned. Consequently, diffusion of $NO_x$ and $HNO_3$ in an ozone generating operation standby period can be decreased at an early stage, and the probability of existence of $NO_x$ and $HNO_3$ in the header 21 at a material gas can be decreased. Consequently, $NO_x$ and $HNO_3$ will not enter inside a high voltage electrode tube, corrosion and degradation will not be generated in a high voltage electrode, as a result, a highly reliable intermittent operation system can be provided.

This invention is not limited to the configuration and operation of each embodiment which are described in the above, within the range of this invention, embodiments may be combined or mode of each embodiment may be appropriately changed or omitted.

REFERENCE CHARACTERS 1. gas supplying device
2. ozone generating apparatus
3. power supply
6. cooling device
8. control unit
20. discharge electrode part
22, 22C, 22D, 23. absorbent
201. ground electrode tube
202. dielectric tube
203. high voltage electrode
211. micro through hole
33. circulating fan

The invention claimed is:

1. An ozone generating system comprising
an ozone generating apparatus having discharge electrodes which are arranged facing each other so as to form a discharge space,
a gas supplying device for supplying a material gas including oxygen to the ozone generating apparatus,
a cooling device for supplying cooling water for cooling the discharge electrodes,
a power supply for supplying electricity to the discharge electrodes for discharging and
a control unit for controlling the gas supplying device and the power supply,
wherein the control unit is configured to perform an intermittent operation, in which an ozone generating operation period in which ozone is generated by the ozone generating apparatus by supplying a material gas from the gas supplying device to the ozone generating apparatus and by supplying of electricity from the power supply to the discharge electrodes and an ozone generating operation standby period in which supplying of gas from the gas supplying device to the ozone generating apparatus and supplying of electricity from the power supply to the discharge electrodes is stopped are alternately repeated,
wherein the control unit is configured to seal the material gas in the ozone generating apparatus in the ozone generating operation standby period, and
an absorbent, which is configured to absorb at least one of nitric acid and nitrogen oxide is provided at a position which is in the ozone generating apparatus other than the discharge space and is contacted with the sealed material gas.

2. The ozone generating system according to claim 1, wherein the control unit is configured to control gas pressure in the ozone generating apparatus in the ozone generating operation standby period to be higher than gas pressure in the ozone generating operation period.

3. The ozone generating system according to claim 1, wherein each of the discharge electrodes comprises:
a ground electrode tube which is a metal tube having a circular section, and
a dielectric tube having a metal film formed in an inner wall which is provided in the ground electrode tube so as to have a predetermined gap between an outer wall of the dielectric tube and an inner wall of the ground electrode,
wherein a supplying side of the material gas of the dielectric tube is opened,
a side which is opposite to the supplying side of the material gas is closed, and
a diameter of the dielectric tube is 30 mm or less.

4. The ozone generating system according to claim 3, wherein the absorbent is provided in the dielectric tube.

5. The ozone generating system according to claim 4, wherein a micro through hole is provided at a wall surface which is opposite to the supplying side of the material gas of the dielectric tube.

6. The ozone generating system according to claim 1, wherein the absorbent is provided in the ozone generating apparatus at a side which is closer to a supplying side of the material gas than the discharge space.

7. The ozone generating system according to claim 1, wherein a plurality of the ozone generating apparatuses are provided, and the control unit is configured to control such that at least one of the ozone generating apparatus of the plurality of ozone generating apparatuses performs the intermittent operation.

8. The ozone generating system according to claim 1, wherein the control unit controls such that in a part of the ozone generating operation standby period, a small quantity of the material gas is supplied to an ozone generating apparatus in the ozone generating operation standby period.

9. The ozone generating system according to claim 1, wherein the material gas is dry air.

10. The ozone generating system according to claim 1, wherein the material gas is oxygen gas which is generated by a Pressure Swing Adsorption type oxygen generating device or a Vacuum Pressure Swing Adsorption type oxygen generating device.

11. The ozone generating system according to claim 1, wherein a distance between the discharge electrodes which are arranged facing each other is 0.1 mm or more and 0.6 mm or less.

12. The ozone generating system according to claim 1, wherein the control unit is configured to control such that in a part of the ozone generating operation standby period, gas which is sealed in the ozone generating apparatus is circulated in the ozone generating apparatus in the ozone generating operation standby period.

13. An operation method of an ozone generating system comprising an ozone generating apparatus having discharge electrodes which are arranged facing each other so as to form a discharge space, a gas supplying device supplying a material gas including oxygen to the ozone generating apparatus, a cooling device supplying cooling water for cooling the discharge electrodes, a power supply supplying electricity to the discharge electrodes for discharging and a control unit which controls the gas supplying device and the power supply, wherein the operation method of an ozone generating system comprises:

an ozone generating operation period in which the ozone generating apparatus generates ozone by supplying a material gas from the gas supplying device to the zone generating apparatus and by supplying electricity from the power supply to the discharge electrodes and an ozone generating operation standby period in which supplying of gas from the gas supplying device to the ozone generating apparatus and supplying of electricity from the power supply to the discharge electrodes are stopped, gas pressure in the ozone generating apparatus is made to be higher than gas pressure in the ozone generating apparatus in the ozone generating operation period and the material gas is sealed in the ozone generating apparatus, and in the ozone generating operation standby period, at least one of nitric acid and nitrogen oxide in the sealed material gas is absorbed by an absorbent, which is provided at a position which is contacted with the sealed material gas, which absorbs at least one of nitric acid and nitrogen oxide.

14. The operation method of an ozone generating system according to claim 13, wherein the ozone generating system comprises a plurality of the ozone generating apparatuses, and at least one of the ozone generating apparatuses has the ozone generating operation standby period.

15. The operation method of an ozone generating system according to claim 13, wherein the ozone generating operation standby period has a purge period in which purge gas is supplied to an ozone generating apparatus in the ozone generating operation standby period.

16. An ozone generating system, in which ozone is generated from a material gas to be outputted, comprising a gas supplying device for supplying a material gas, an ozone generating apparatus configured to have an ozone generating operation period in which an ozone is generated by using the material gas which is supplied by the gas supplying device and an ozone generating operation standby period in which an ozone is not generated, a first valve through which the material gas, which is supplied by the gas supplying device, is introduced to the ozone generating apparatus, a second valve through which the ozone, which is generated by the ozone generating apparatus, is outputted and an absorbent, which is configured to absorb at least one of nitric acid and nitrogen oxide, which is provided in the ozone generating apparatus, wherein in a case of the ozone generating operation period, the first valve and the second valve are opened, and the ozone is outputted from the second valve, and in a case of the ozone generating operation standby period, the first valve and the second valve are closed, and gas in the ozone generating apparatus is sealed in the ozone generating apparatus.

\* \* \* \* \*

UNITED STATES PATENT AND TRADEMARK OFFICE
CERTIFICATE OF CORRECTION

PATENT NO.         : 10,544,045 B2
APPLICATION NO.    : 15/503957
DATED              : January 28, 2020
INVENTOR(S)        : Noboru Wada et al.

Page 1 of 1

It is certified that error appears in the above-identified patent and that said Letters Patent is hereby corrected as shown below:

Column 31, Line 13, Claim 13 "device to the zone generating apparatus" should read --device to the ozone generating apparatus--

Signed and Sealed this
Thirty-first Day of March, 2020

Andrei Iancu
*Director of the United States Patent and Trademark Office*